United States Patent
Chandrasekharan et al.

(10) Patent No.: US 8,985,152 B2
(45) Date of Patent: Mar. 24, 2015

(54) POINT OF USE VALVE MANIFOLD FOR SEMICONDUCTOR FABRICATION EQUIPMENT

(71) Applicants: Ramesh Chandrasekharan, Portland, OR (US); Chunguang Xia, Tualatin, OR (US); Karl F. Leeser, West Linn, OR (US); Damien Slevin, Salem, OR (US); Thomas G. Jewell, Tualatin, OR (US)

(72) Inventors: Ramesh Chandrasekharan, Portland, OR (US); Chunguang Xia, Tualatin, OR (US); Karl F. Leeser, West Linn, OR (US); Damien Slevin, Salem, OR (US); Thomas G. Jewell, Tualatin, OR (US)

(73) Assignee: Novellus Systems, Inc., San Jose, CA (US)

( * ) Notice: Subject to any disclaimer, the term of this patent is extended or adjusted under 35 U.S.C. 154(b) by 249 days.

(21) Appl. No.: 13/626,717

(22) Filed: Sep. 25, 2012

(65) Prior Publication Data

US 2013/0333768 A1   Dec. 19, 2013

Related U.S. Application Data

(60) Provisional application No. 61/660,606, filed on Jun. 15, 2012.

(51) Int. Cl.
*F16K 1/00* (2006.01)
*C23C 16/455* (2006.01)
*F16K 27/00* (2006.01)

(52) U.S. Cl.
CPC ..... *C23C 16/45544* (2013.01); *C23C 16/45561* (2013.01); *F16K 27/003* (2013.01)
USPC ............................ 137/884; 137/597; 137/606

(58) Field of Classification Search
CPC ................... F16K 27/003; H01L 21/67017
USPC ..................... 137/597, 602, 605, 606, 884
See application file for complete search history.

(56) References Cited

U.S. PATENT DOCUMENTS

| 5,823,228 | A * | 10/1998 | Chou ............................. 137/597 |
| 7,784,496 | B2 * | 8/2010 | Taskar ........................... 137/884 |
| 8,372,201 | B2 | 2/2013 | Provencher |
| 8,465,801 | B2 | 6/2013 | Schmidt |
| 2001/0003288 | A1 * | 6/2001 | Clayton et al. ................ 137/884 |
| 2006/0005891 | A1 * | 1/2006 | Doyle ............................ 137/884 |
| 2009/0250126 | A1 * | 10/2009 | Koyomogi .................... 137/606 |
| 2012/0227848 | A1 * | 9/2012 | Oya et al. ...................... 137/884 |

FOREIGN PATENT DOCUMENTS

CN   103510070   1/2014

* cited by examiner

*Primary Examiner* — John K Fristoe, Jr.
*Assistant Examiner* — Reinaldo Sanchez-Medina
(74) *Attorney, Agent, or Firm* — Weaver Austin Villeneuve & Sampson

(57) ABSTRACT

A point-of-use valve (POU valve) manifold is provided that allows for multiple precursors to be delivered to a semiconductor processing chamber through a common outlet. The manifold may have a plurality of precursor inlets and a purge gas inlet. The manifold may be configured such that there are zero dead legs in the manifold when the purge gas is routed through the manifold, and may provide mounting location for the POU valves that alternate sides. One or more internal flow path volumes may include elbow features.

30 Claims, 23 Drawing Sheets

1

POINT OF USE VALVE MANIFOLD FOR SEMICONDUCTOR FABRICATION EQUIPMENT

CROSS-REFERENCE TO RELATED APPLICATION

This application claims benefit of priority under 35 U.S.C. §119(e) to U.S. Provisional Patent Application No. 61/660,606, entitled "POINT OF USE VALVE MANIFOLD FOR SEMICONDUCTOR FABRICATION EQUIPMENT" filed Jun. 15, 2012, which is incorporated herein by reference in its entirety and for all purposes.

BACKGROUND

In an atomic layer deposition (ALD) tool, multiple precursors may be used to facilitate semiconductor wafer manufacturing processes. The precursors may form a deposition layer upon combining. To prevent premature deposition, i.e., within the gas or fluid lines leading to the process chamber, the precursors may be kept separate from each other.

SUMMARY OF THE INVENTION

The systems, methods and devices of the disclosure each have several innovative aspects, no single one of which is solely responsible for the desirable attributes disclosed herein. One innovative aspect of the subject matter described in this disclosure can be implemented in a variety of ways.

In some implementations, a valve manifold for use in a semiconductor processing tool may be provided. The valve manifold may include a manifold body. The manifold body may include a purge gas inlet, a manifold outlet, the manifold outlet located on a first side of the manifold body, a first valve interface, the first valve interface located on a second side of the manifold body different from the first side, and a second valve interface, the second valve interface located on a third side of the manifold body different from the first side and the second side. The first valve interface and the second valve interface may each include a first port, a second port, and a third port. The second port of the first valve interface may be configured to connect to a first process gas supply, and the third port of the first valve interface may be fluidly connected with the first port of the second valve interface via a first flow path internal to the manifold body and having no dead legs. The second port of the second valve interface may be fluidly connected with an interface configured to connect to a second process gas supply, and the third port of the second valve interface may be fluidly connected with the manifold outlet by a second flow path internal to the manifold body and having no dead legs.

In some further implementations, the purge gas inlet may be fluidly connected with the first port of the first valve interface by a third flow path internal to the manifold body and having no dead legs.

In some further implementations, the valve manifold may further include a purge valve interface. The purge valve interface may include a first port and a second port. The purge gas inlet may be fluidly connected with the first port of the purge valve interface by a third flow path internal to the manifold body, and the second port of the purge valve interface may be fluidly connected with the first port of the first valve interface by a fourth flow path internal to the manifold body and having no dead legs.

In some further implementations, the valve manifold may further include a dump shunt outlet and a dump shunt valve interface. The dump shunt valve interface may include a first port and a second port. The first port of the dump shunt valve interface may be fluidly connected with the second port of the second valve interface by a fifth flow path internal to the manifold body, and the second port of the dump shunt valve interface may be fluidly connected with the dump shunt outlet by a sixth flow path internal to the manifold body.

In some further implementations, the side of the manifold body where the manifold outlet is located may be configured to be attached to mating features on a semiconductor processing chamber.

In some further implementations, there may be an overlap between a first reference volume defined by a projection of the outer boundary of the first valve interface in a direction substantially normal to the second side and a second reference volume defined by a projection of the outer boundary of the second valve interface in a direction substantially normal to the third side.

In some further implementations, the manifold body may further include one or more heater interfaces, each configured to accept a heating device. In some further implementations, the one or more heater interfaces may be receptacles within the manifold body.

In some implementations, an apparatus for delivery of a purge gas, a first process gas, and a second process gas to a semiconductor processing tool may be provided. The apparatus may include a valve manifold, a first valve, and a second valve. The valve manifold may include a manifold body. The manifold body may include a purge gas inlet, a manifold outlet, the manifold outlet located on a first side of the manifold body, a first valve interface, the first valve interface located on a second side of the manifold body different from the first side, and a second valve interface, the second valve interface located on a third side of the manifold body different from the first side and the second side. The first valve interface and the second valve interface may each include a first port, a second port, and a third port. The second port of the first valve interface may be configured to connect to a first process gas supply, and the third port of the first valve interface may be fluidly connected with the first port of the second valve interface via a first flow path internal to the manifold body and having no dead legs. The second port of the second valve interface may be fluidly connected with an interface configured to connect to a second process gas supply, and the third port of the second valve interface may be fluidly connected with the manifold outlet by a second flow path internal to the manifold body and having no dead legs. The first valve and the second valve may each include a valve body, a manifold interface area including a first valve port, a second valve port, and a third valve port, and a valve mechanism movable between an open state and a closed state. The first valve port may be fluidly connected to the third valve port when the valve mechanism is in both the open state and in the closed state, and the second valve port may be fluidly connected to the first valve port and the third valve port when the valve mechanism is in the open state and may not be not fluidly connected to the first valve port and the third valve port when the valve mechanism is in the closed state. The first valve port of the first valve may be fluidly connected to the first port of the first valve interface, the second valve port of the first valve may be fluidly connected to the second port of the first valve interface, the third valve port of the first valve may be fluidly connected to the third port of the first valve interface, the first valve port of the second valve may be fluidly connected to the first port of the second valve interface, the second valve port of the second valve may be fluidly connected to the second port of the second valve interface, and the third valve port of the second valve may be fluidly connected to the third port of the second valve interface.

In some further implementations of the apparatus, the apparatus may also include a first gasket that provides a seal between the first valve port of the first valve and the first port of the first valve interface, a second gasket that provides a seal between the second valve port of the first valve and the second port of the first valve interface, a third gasket that provides a seal between the third valve port of the first valve and the third port of the first valve interface, a fourth gasket that provides a seal between the first valve port of the second valve and the first port of the second valve interface, a fifth gasket that provides a seal between the second valve port of the second valve and the second port of the second valve interface, and a sixth gasket that provides a seal between the third valve port of the second valve and the third port of the second valve interface.

In some further implementations of such an apparatus, the first gasket, the second gasket, the third gasket, the fourth gasket, the fifth gasket, and the sixth gasket may each be selected from the group consisting of a C seal, a W seal, and an elastomeric seal.

In some further implementations of the apparatus, the purge gas inlet may be fluidly connected with the first port of the first valve interface by a third flow path internal to the manifold body and having no dead legs.

In some further implementations of the apparatus, the valve manifold may further include a purge valve interface. The purge valve interface may include a first port and a second port. The purge gas inlet may be fluidly connected with the first port of the purge valve interface by a third flow path internal to the manifold body, and the second port of the purge valve interface may be fluidly connected with the first port of the first valve interface by a fourth flow path internal to the manifold body and having no dead legs.

In some further implementations of the apparatus, the valve manifold may further include a dump shunt outlet and a dump shunt valve interface. The dump shunt valve interface may include a first port and a second port. The first port of the dump shunt valve interface may be fluidly connected with the second port of the second valve interface by a fifth flow path internal to the manifold body, and the second port of the dump shunt valve interface may be fluidly connected with the dump shunt outlet by a sixth flow path internal to the manifold body.

In some further implementations of the apparatus, the side of the manifold body where the manifold outlet is located may be configured to be mated with mating features on a semiconductor processing chamber.

In some further implementations of the apparatus, there may be an overlap between a first reference volume defined by a projection of the outer boundary of the first valve interface in a direction substantially normal to the second side and a second reference volume defined by a projection of the outer boundary of the second valve interface in a direction substantially normal to the third side.

In some further implementations of the apparatus, the manifold body may further include one or more heater interfaces, each configured to accept a heating device. In some such further implementations of the apparatus, the one or more heater interfaces may be receptacles within the manifold body.

In some further implementations of the apparatus, the first flow path within the manifold body may include a flow restriction that is greater than either a maximum first flow restriction through the first valve or a maximum second flow restriction through the second valve when the valve mechanism of the first valve is in the open state and the valve mechanism of the second valve is in the open state, respectively.

In some further implementations of the apparatus, the second flow path within the manifold body may include a flow restriction that is greater than either a maximum first flow restriction through the first valve or a maximum second flow restriction through the second valve when the valve mechanism of the first valve is in the open state and the valve mechanism of the second valve is in the open state, respectively.

In some further implementations of the apparatus, the apparatus may include a temperature sensor configured to monitor the temperature of the manifold body.

Details of one or more implementations of the subject matter described in this specification are set forth in the accompanying drawings and the description below. Other features, aspects, and advantages will become apparent from the description, the drawings, and the claims.

DRAWINGS

FIGS. 1A through 2L are drawn to scale (although the flow volumes for the POU valves and the extension volumes may not be representative of the size or shape of actual flow volumes).

DETAILED DESCRIPTION

The techniques and devices disclosed herein may be implemented in a variety of ways, including, but not limited to, the various implementations described below. It is to be understood that one of ordinary skill in the art may use the techniques and devices described herein to produce other implementations consistent with the information disclosed in this document, and that such alternative implementations are also to be considered as within the scope of this disclosure.

Figure 1A:
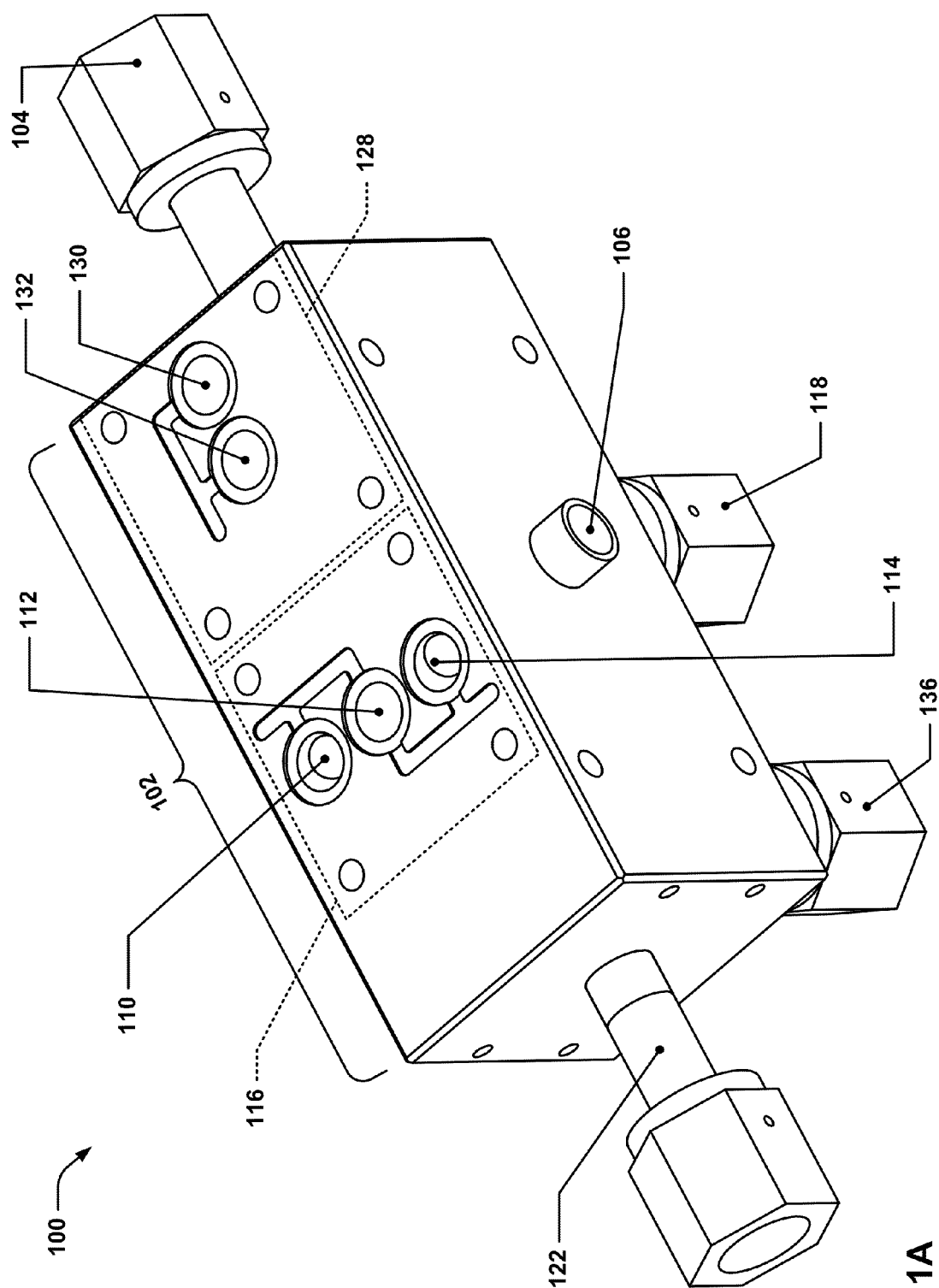
FIG. 1A shows an off-angle view of an example point-of-use (POU) valve manifold supporting two precursors, a purge/carrier gas source, a precursor dump shunt, and an outlet.

FIG. 1A shows an off-angle view of an example point-of-use (POU) valve manifold 100 supporting two precursors. The valve manifold 100 includes a manifold body 102, e.g., a block of material such as stainless steel, and includes internal passages for transporting gases or fluids to various destinations, including a purge/carrier gas source, a precursor dump shunt, and an outlet. As can be seen, a manifold outlet 106 may be provided that connects, e.g., via a showerhead or gas distribution manifold, to a semiconductor processing chamber. Also shown are a first process gas supply inlet 118 for a first precursor, a second process gas supply inlet 122 for a second precursor, and a purge gas inlet 104. A dump shunt outlet 136 associated with the second process gas supply inlet 120 is also visible. Two c-seal surfaces are also visible on the top surface of the valve manifold 100. In this particular design, high-flow C-seals are used to seal the valve interfaces. However, other seal technologies may be used as well, including, but not limited to, 1.125" standard C-seals, W-seals, elastomeric seals, etc, as consonant with design requirements. The arrangement shown here is configured to allow one 2-port and one 3-port valve to be mounted on the top surface of the manifold. The 3-port valve may be mounted to a second valve interface 116 (a first valve interface is described below but is not visible in this view) that may include a first port 110, a second port 112, and a third port 114. The 2-port valve may be mounted to a purge valve interface 128 that may include a first port 130 and a second port 132.

Figure 1B:
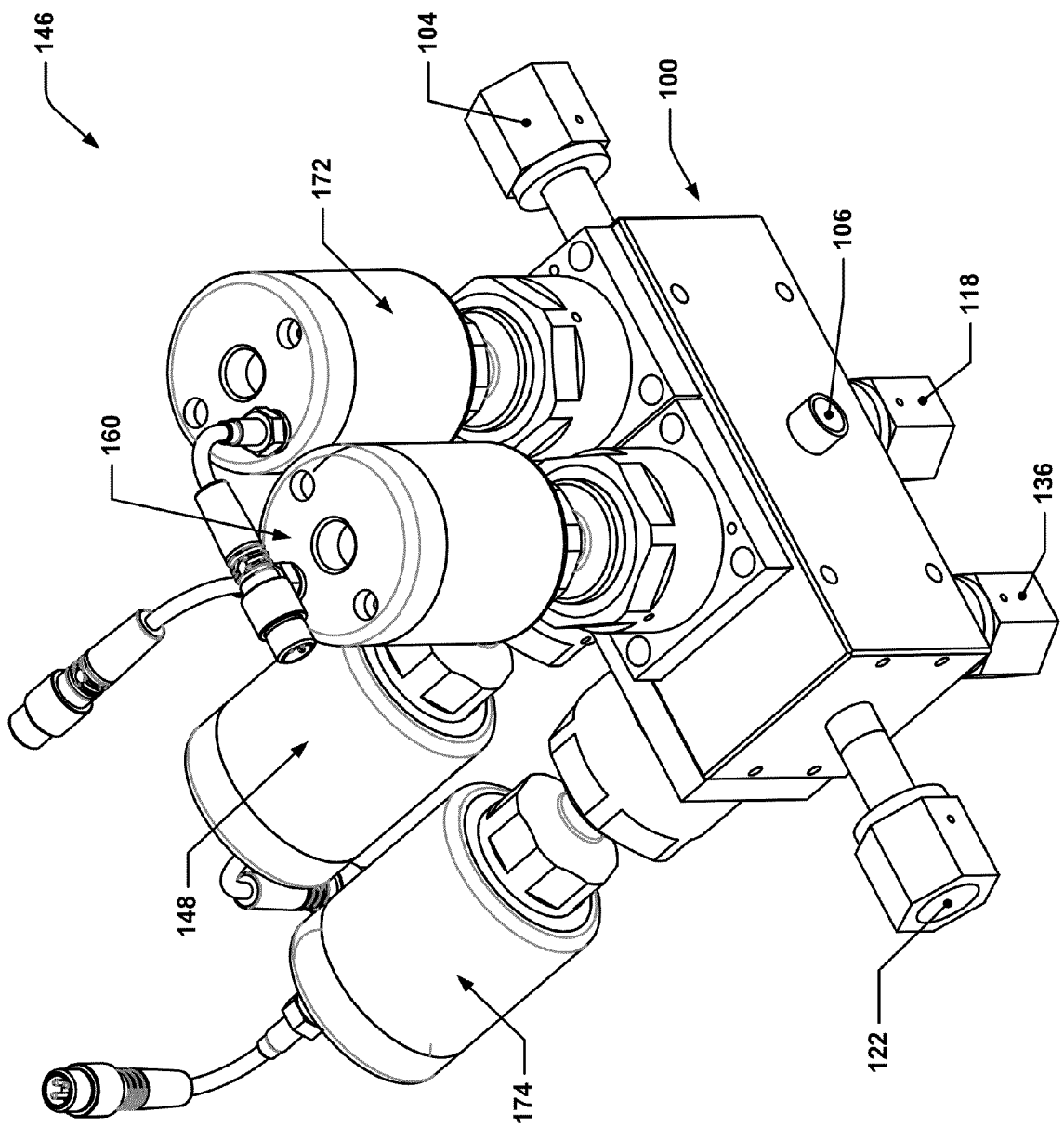
FIG. 1B shows the example POU valve manifold of FIG. 1A with commercial-off-the-shelf (COTS) valves attached.

FIG. 1B shows the POU valve manifold 100 of FIG. 1A with valves attached. COTS valves or custom 2-port or 3-port port diaphragm or similar valves may be used. A valve manifold apparatus 146 may be formed by connecting, for example, a first valve 148 to a first valve interface (not visible in this view), a second valve 160 to the second valve interface, a purge valve 172 to the purge valve interface 128, and a dump valve 174 to a dump shunt interface (not visible in this view).

Figure 1C:
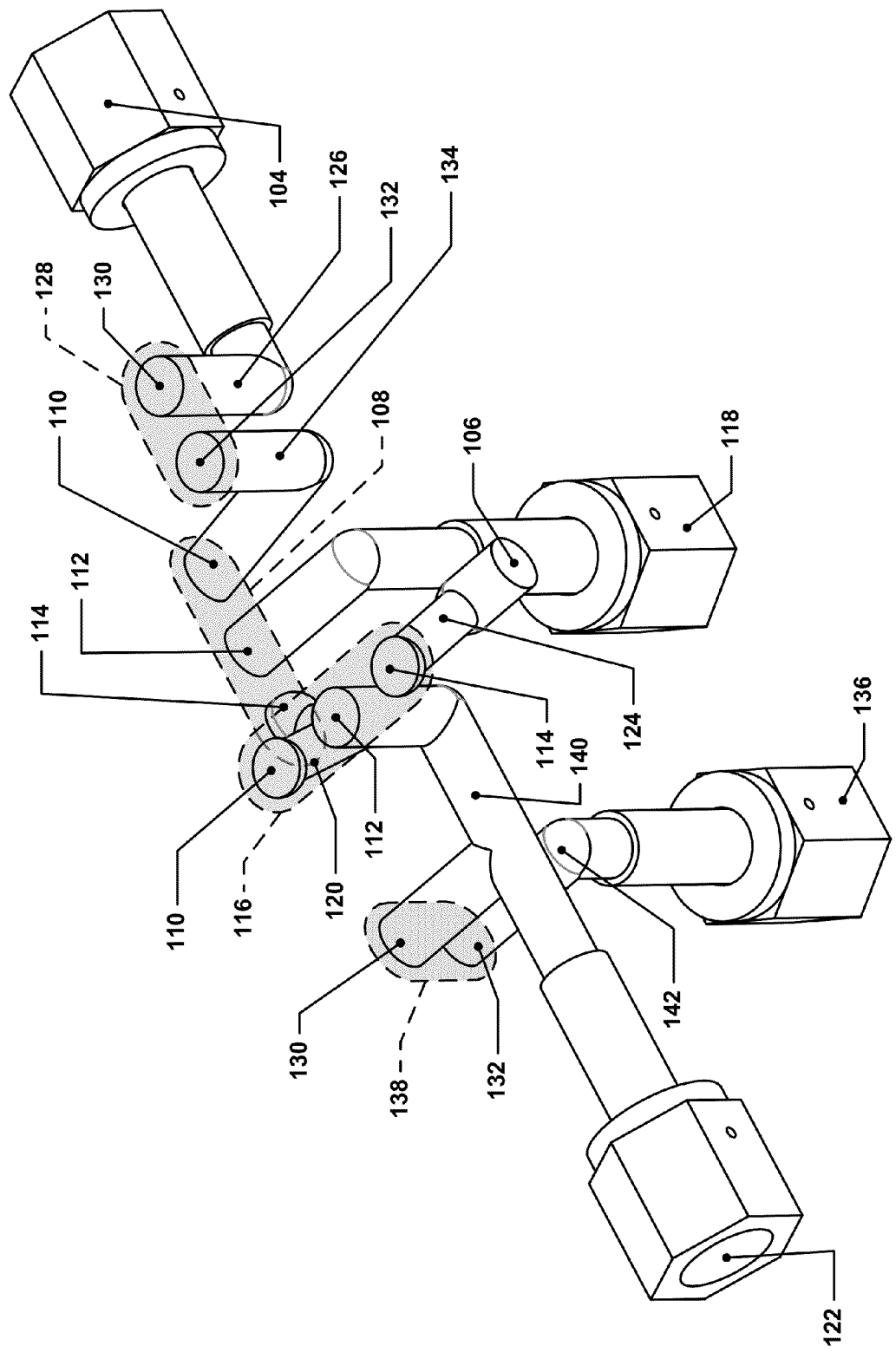
FIG. 1C shows the internal flow path volumes of the example POU valve manifold of FIG. 1A.

FIG. 1C shows the internal flow path volumes of the example POU valve manifold 100 of FIG. 1A. As can be seen, the internal flow paths of the manifold experience all have elbows in them. While elbows are not required for every internal flow path in such manifolds, the use of at least some elbows interior to the manifold allows the valves to be mounted in a very dense packaging arrangement. This may be of particular benefit given that a POU valve manifold may be mounted in very close proximity to a showerhead of a semiconductor processing tool and space constraints in such locations may severely limit the size of such manifolds. While the flow path volumes for the valves are not shown, the shaded oval areas indicate the regions where valves 148, 160, 172, and 174 may be connected to the flow path volumes internal to the manifold. The flow paths in this particular implementation have a nominal diameter of about 0.3". The use of elbows also allows for a reduced internal volume and, consequently, purge volume. This reduces operating costs, since less process gas is purged during each purge cycle.

Visible in FIG. 1C are the purge gas inlet 104, the manifold outlet 106, the first process gas supply inlet 118, and the second process gas supply inlet 122. Also visible in FIG. 1C are shaded areas indicating the various valve interfaces supported by the valve manifold 100 (the shaded areas are used to indicate groupings of ports that are included in each valve interface—the valve interface, e.g., the seals, mounting features, etc., may actually be larger and of a different shape from the shaded region shown). As can be seen, the first valve interface 108 is visible, as is the dump shunt valve interface 138 (these were obscured by the manifold body 102 in previous Figures). The first valve interface 108 may, similar to the second valve interface 116, include a first port 110, a second port 112, and a third port 114, and the dump shunt valve interface 138, similar to the purge valve interface 28, may include a first port 130 and a second port 132. Various interconnections between the various ports visible in FIG. 1C are discussed below.

The third port 114 of the first valve interface 108 may be fluidly connected to the first port 110 of the second valve interface 116 by a first flow path 120 (the first flow path 120 may be more visible in later Figures from a different viewpoint). A second flow path 124 may fluidly connect the third port 114 of the second valve interface 116 with the manifold outlet 106. A third flow path 126 may fluidly connect the first port 130 of the purge valve interface 128 with the purge gas inlet 104, and a fourth flow path 134 may fluidly connect the second port 132 of the purge valve interface 128 with the first port 110 of the first valve interface 108. Finally, a fifth flow path 140 may fluidly connect the second port 112 of the second valve interface 116 to the second process gas supply inlet 122 and, via a spur, the first port 130 of the dump shunt valve interface 138, and a sixth flow path 142 may fluidly connect the second port 132 of the dump shunt valve interface 138 to the dump shunt outlet 136.

Figure 1D:
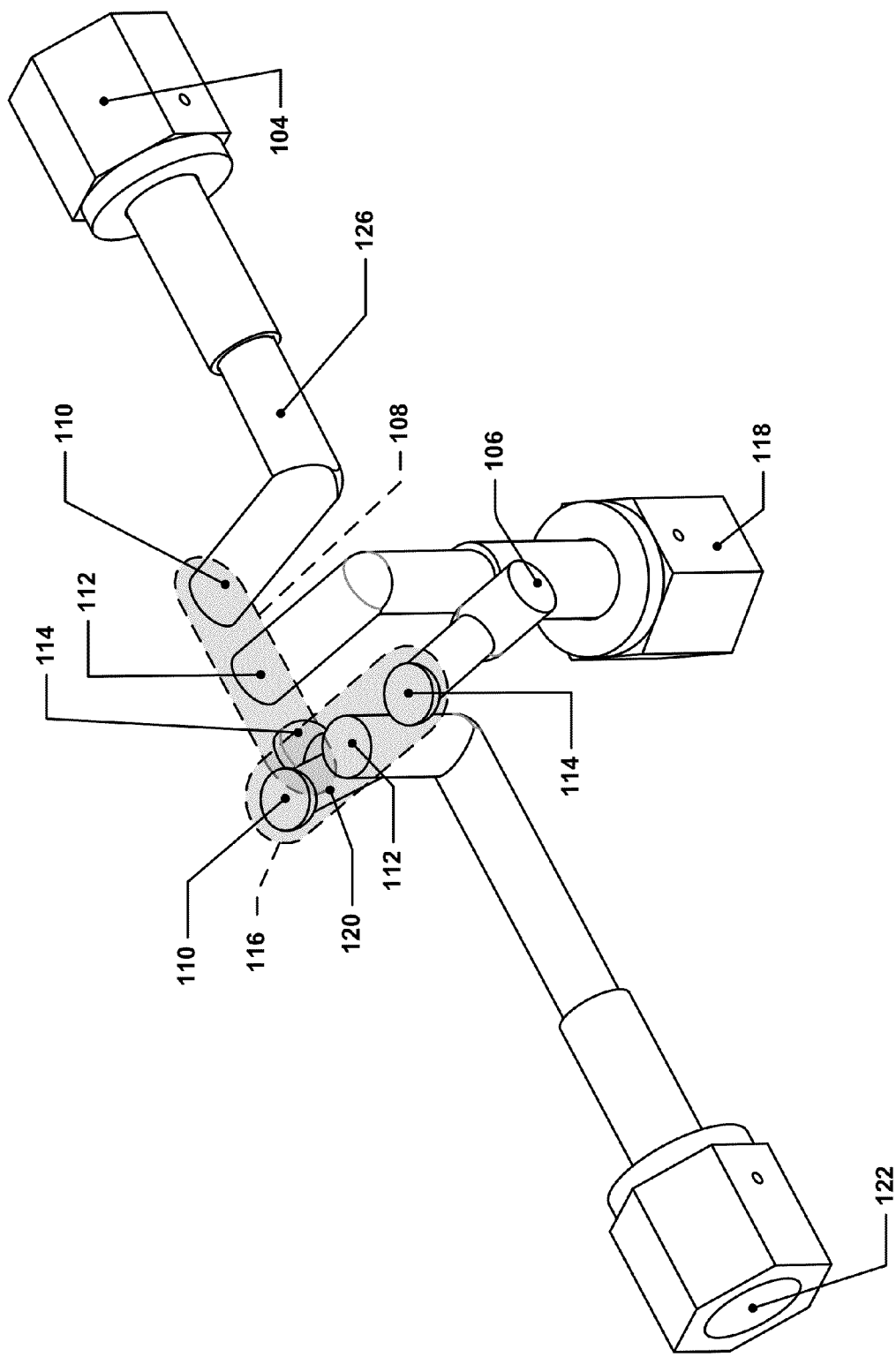
FIG. 1D shows the internal flow path volumes of a variant of the example POU valve manifold of FIG. 1A.

FIG. 1D depicts an alternate internal flow path arrangement for a POU valve manifold without a dump shunt feature and having an off-manifold purge valve. Thus, in the depicted variant, the third flow path 126 fluidly connects the purge gas inlet 104 directly to the first port 110 of the first valve interface 108. Purge gas flow control may, in such an implementation, be provided by an off-manifold valve. Additionally, the fifth flow path 140 does not include the spur to a dump shunt valve interface. This alternate configuration is provided merely to illustrate that there may be many alternative permutations of valve interfaces and flow paths that are consonant with the provided disclosure, and that should be viewed as being within the scope of this disclosure.

Figure 1E:
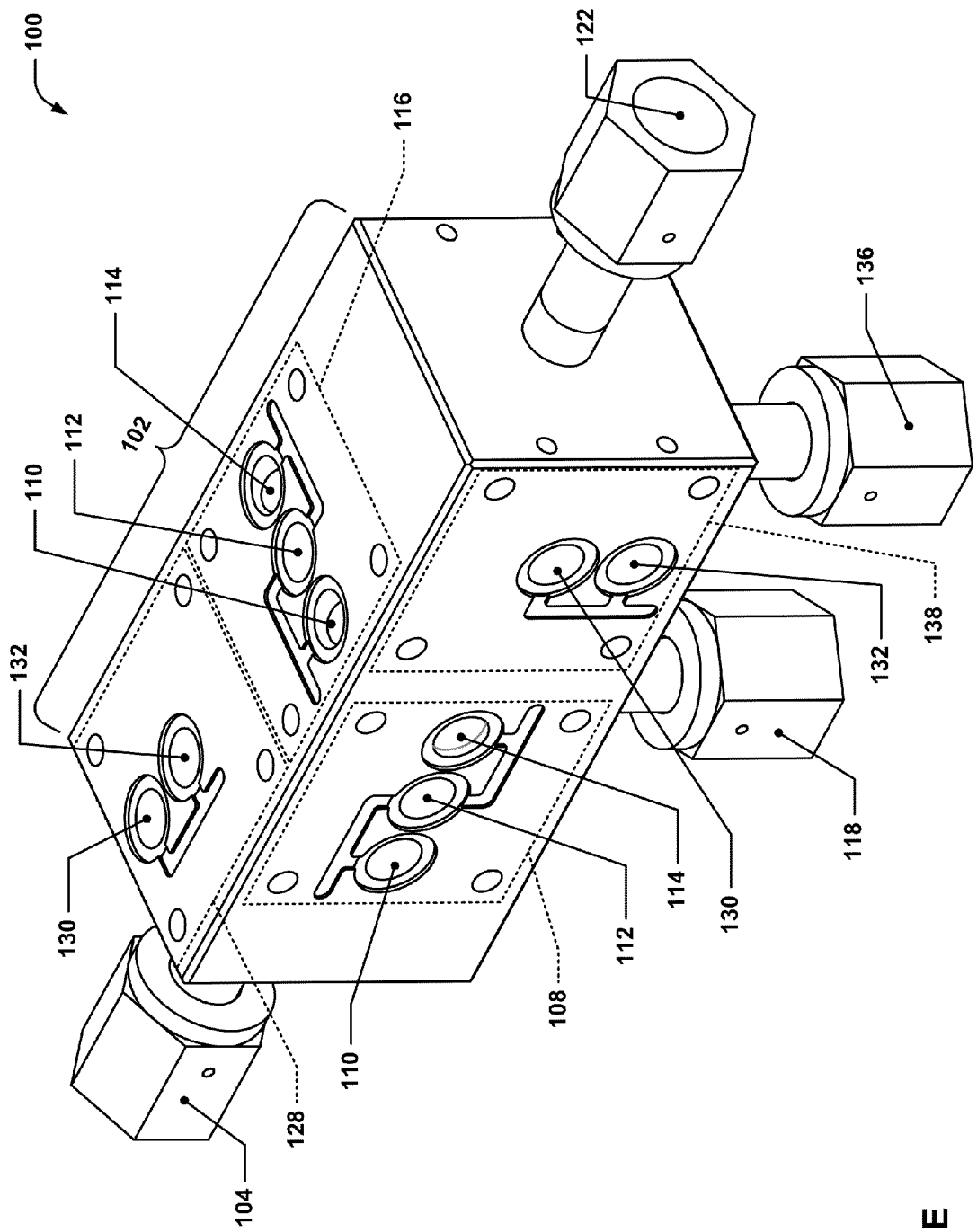
FIG. 1E shows a different off-angle view of the example POU valve manifold of FIG. 1A.

Turning now to FIG. 1E, which shows the valve manifold 100 of FIGS. 1A through 1C from a perspective revealing the "back" of the valve manifold 100 (it is to be understood that the term "back" is simply used to refer to a surface of the valve manifold 100 that was not visible in previous Figures), it is apparent that the valves/valve interfaces may be arranged in an alternating, staggered fashion on two different faces of the manifold. For example, the second valve interface 116 and the purge valve interface 128 are on the "top" face of the manifold, and the first valve interface 108 and the dump shunt valve interface 138 are on the "back" face of the valve manifold 100. As is also apparent from FIG. 1E, the valve interfaces overlap each other along the long axis of the valve manifold 100, which allows the valve manifold 100 to support a smaller-than-normal package size. Due to this alternating valve placement, the use of elbows may be necessary in some cases to "turn" the corners between two adjacent POU valves. The elbows may be straight, e.g., the right elbow from V2 the first valve interface 108 to the first process gas supply inlet 118, or somewhat angled, e.g., the right elbow joining the third valve interface 128 and the first valve interface 108 or the angled elbow between the first valve interface 108 and the second valve interface 116. In addition to reducing the exterior space envelope of the manifold and POU valves, the arrangement pictured also provides for a reduced flow path volume inside of the manifold. This reduces the amount of precursor gas that must be purged (and is wasted) during each purge cycle, thus increasing process consumables efficiency. Another beneficial aspect of such a design is that wafer throughput is increased since the time needed to purge is lower due to the lower purge volume. Additionally, due to the reduced internal volume, precursor gases may be removed with greater efficiency during a given purge cycle time, resulting in the manifold staying cleaner, i.e., there is a decreased chance of residual precursors mixing and reacting within the manifold.

Figure 1F:
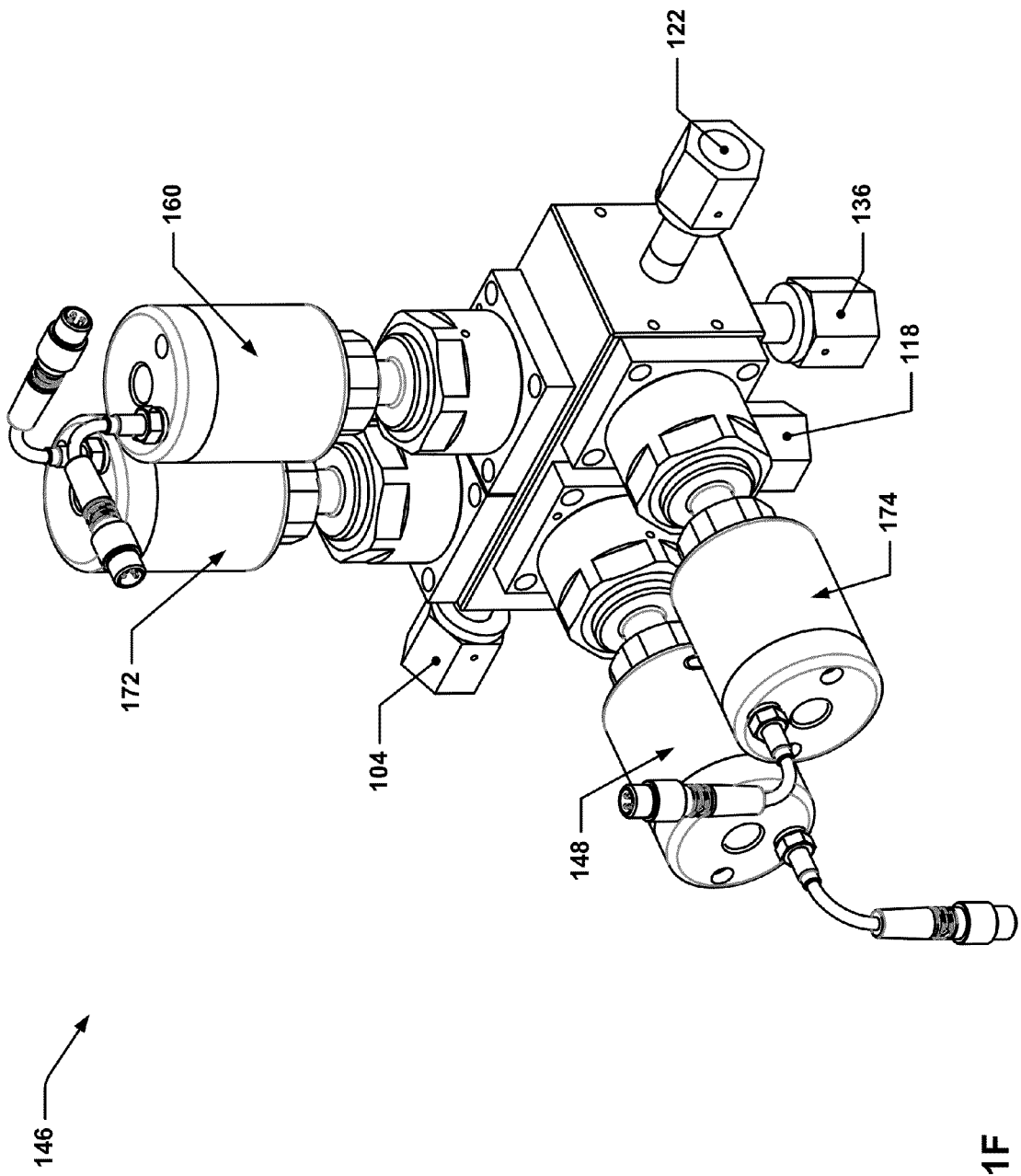
FIG. 1F shows the example POU valve manifold of FIG. 2A with COTS valves attached.
Figure 1G:
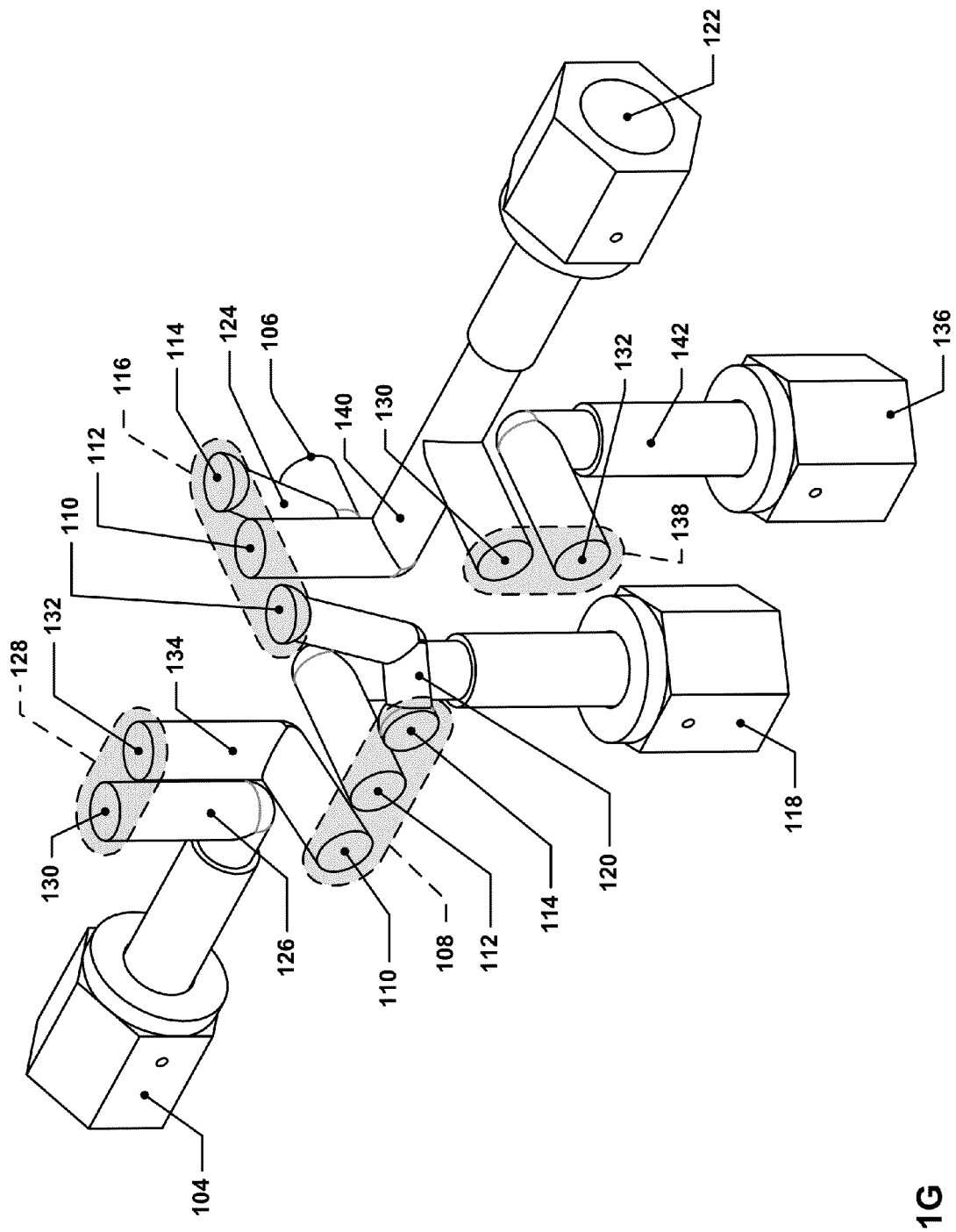
FIG. 1G shows the internal flow path volumes of the example POU valve manifold of FIG. 1A.

FIG. 1F shows the same valve manifold apparatus 146 as shown in FIG. 1B, but from the perspective used in FIG. 1E. Similarly, FIG. 1G shows the internal flow path volumes of the valve manifold 100 of FIG. 1C, but from the perspective used in FIGS. 1E and 1F. FIGS. 1H through 1L depict the flow path volumes shown in FIG. 1G during various states of valve operation.

In FIGS. 1H through 1L, flow path volumes for some of the valves are shown in addition to the flow paths shown for the manifold. The valve flow path volumes may not be representative of actual flow path shape or size (for example, a 3-port valve may have an annular flow path that fluidly connects the first port and the third port of the 3-port valve even when the valve is closed and that passes around the second port of the 3-port valve—when the 3-port valve is opened, a diaphragm valve may open and fluidly connect the second port of the 3-port valve with the annular flow path), but are merely used as figurative aids. For 2-port POU valves, flow through the valve is completely stopped when the valve is closed. The purge valve and the dump shunt valve shown in the previous Figures are both 2-port POU valves. The first valve and the second valve shown in the previous Figures are both 3-port valves where gas may always flow between the two outer ports, and only flow into the central port when the 3-port valve is open. In FIGS. 1H through 1L, flow path volumes terminating in a valve interface port with "X's" on them are "closed."

Figure 1H:
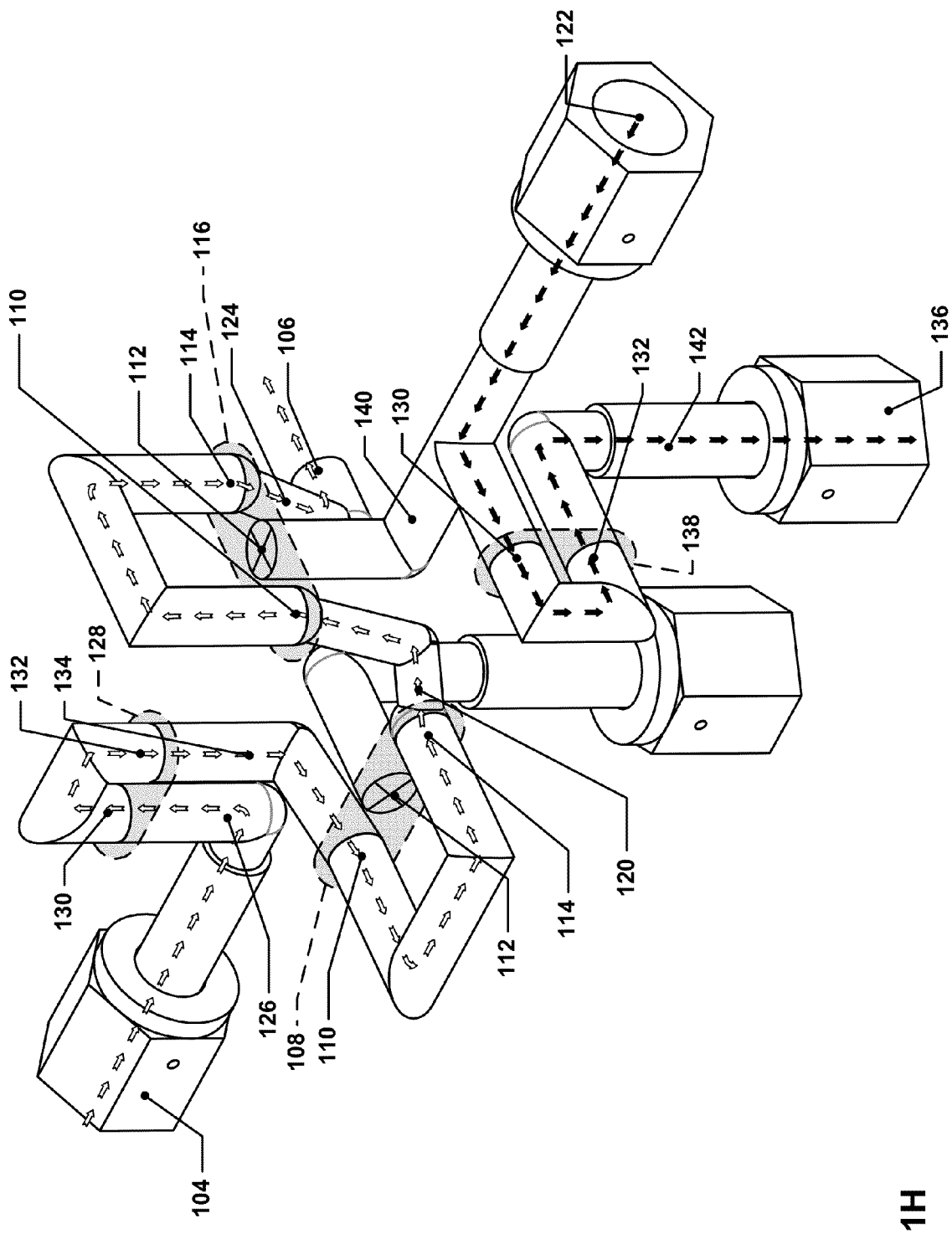
FIG. 1H shows the internal flow path volumes of the example POU valve manifold of FIG. 1A and flow paths associated with a purge cycle accompanied by a precursor dump shunt.

FIG. 1H depicts the valve manifold 100 in a purge state. Flow of the purge gas in FIG. 1H runs through the purge valve, the first valve, and the second valve, and is exhausted through the manifold outlet 106, e.g., into a semiconductor processing chamber inlet, as indicated by the flow path shown with white arrows. As can be seen, there are zero "dead legs" in the flow path for the purge gas, so any gases from the first precursor inlet or the second precursor inlet that are trapped in the flow path for the purge gas will be purged from the valve manifold 100 by the introduction of the purge gas. A dead leg generally refers to a substantial volume of a gas or fluid flow system that may allow gas or fluid that is "upstream" of the dead leg to be evacuated from the system while the gas or fluid that is in the dead leg still remains in the system, e.g., largely stagnant.

While the purge cycle is occurring, the second precursor (shown by black arrows) may kept in a flowing state by directing it into the dump shunt via the dump shunt valve 174. This allows the flow of the second precursor to be continuous even when the second precursor is not being delivered to the chamber, which allows for increased accuracy and control of the second precursor delivery using flow controllers or other control mechanisms that work well in continuous flow modes but that do not work well in high-frequency cycling modes (e.g., controllers with high sensitivity to transient flow behavior), either due to inability to meter at the timescales required, reliability, or both.

Figure 1I:
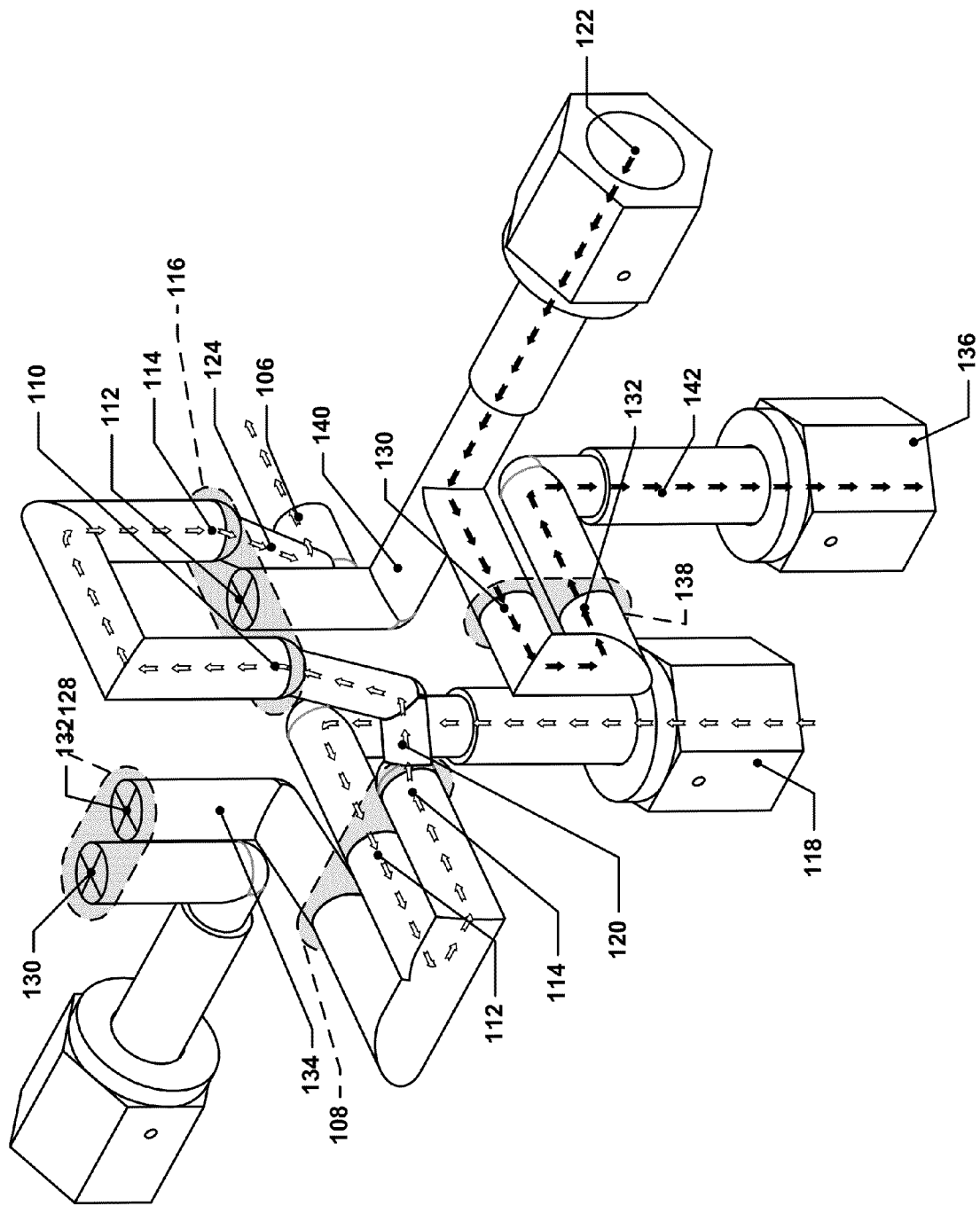
FIG. 1I shows the internal flow path volumes of the example POU valve manifold of FIG. 1A and flow paths associated with a first precursor delivery cycle accompanied by a second precursor dump shunt.

FIG. 1I shows the internal flow path volumes of the example valve manifold 100 and flow paths associated with a first precursor delivery cycle accompanied by a second precursor dump shunt. As can be seen, the purge valve 172 has been closed (represented by X's on the first port 130 and the second port 132 of the purge valve interface 128) and the third flow path volume 126 and the fourth flow path volume 134 have been sealed off from each other by this closure. Additionally, the first valve has been opened, allowing for free flow of the first process gas from the first process gas supply inlet 118 into the third port 114 of the first valve interface 108, through the first flow path 120, out of the first port 110 of the second valve interface 116, into the third port 114 of the second valve interface 116, and out through the manifold outlet 106 (represented by white arrows in this Figure). As in FIG. 1H, the dump valve 174 is open, allowing the second precursor to flow into the dump shunt (represented by black arrows). It is to be understood that, in this flow state, the fourth flow path 134 acts as a dead leg—the first process gas may flow into it, and it may be desirable to purge the fourth flow path 134 with a purge operation, as discussed with reference to FIG. 1H, prior to introducing the second process gas into the valve manifold 100.

Figure 1J:
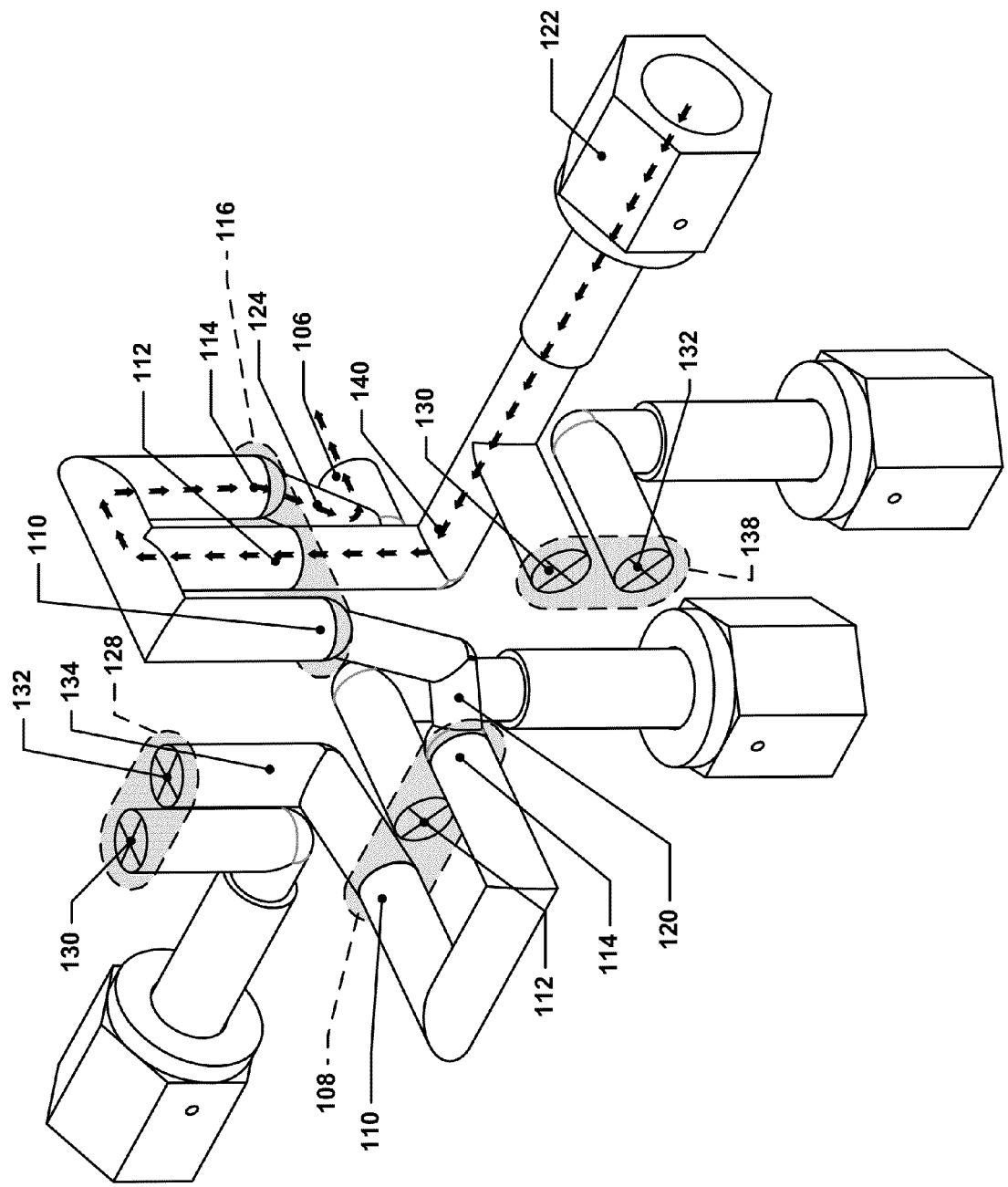
FIG. 1J shows the internal flow path volumes of the example POU valve manifold of FIG. 1A and a flow path associated with a delivery cycle for the second precursor.

FIG. 1J shows the internal flow path volumes of the valve manifold 100 and a flow path associated with a delivery cycle for the second precursor (shown with black arrows). In FIG. 1J, all of the valves except for the second valve have been closed, allowing the second precursor to be delivered to the chamber while preventing delivery of the purge gas or the first process gas. In this flow state, it is to be understood that dead legs may be formed by, for example, the spur off of the fifth flow path 140 that leads to the first port 130 of the dump shunt valve interface 138, as well as the first flow path 120 and the fourth flow path 134 (as well as within the purge valve, the dump valve, the first valve, and a portion of the second valve). The second process gas may flow into these dead legs, and it may be desirable to purge these flow paths with a purge operation, as discussed with reference to FIG. 1H, prior to introducing the other process gases into the valve manifold 100.

Figure 1K:
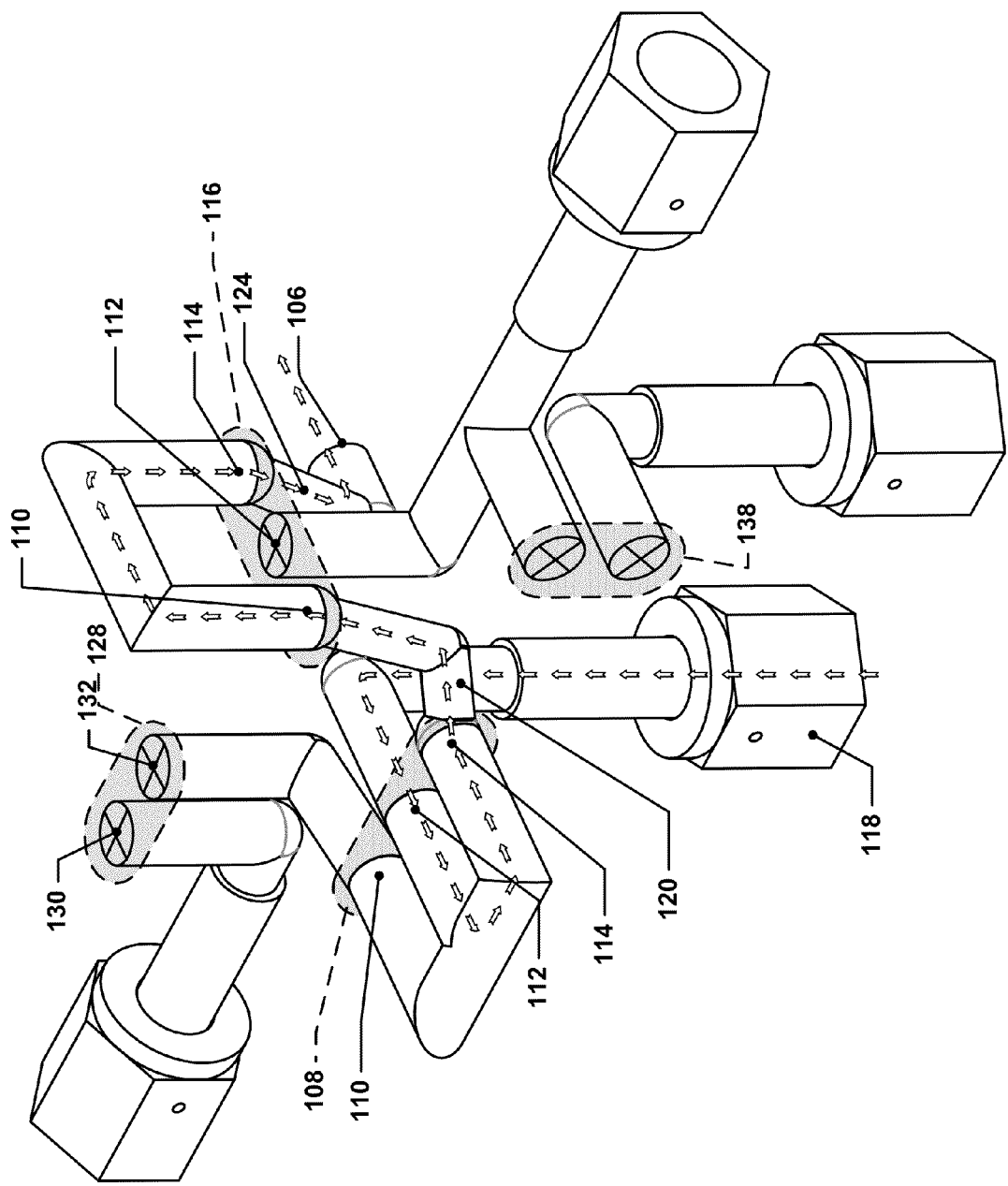
FIG. 1K shows the internal flow path volumes of the example POU valve manifold of FIG. 1A and a flow path associated with a delivery cycle for the first precursor.

FIG. 1K shows the internal flow path volumes of the valve manifold 100 and a flow path (shown with white arrows) associated with a delivery cycle for the first precursor. In FIG. 1K, all of the valves except for the first valve have been closed. The first valve allows the first process gas to be delivered to the chamber via the first flow path 120. In this flow state, the dump valve has been closed, preventing circulation of the second process gas.

As discussed above, it is to be understood that some flow of the precursors may occur into the "dead legs" of the manifold during precursor delivery; these flows of gas are not illustrated with arrows in the above figures. Since all of these dead legs are in the purge gas flow path, any such flow of precursor gas into a dead leg will be flushed out when the purge cycle happens and flows purge gas through the dead leg(s).

Figure 1L:
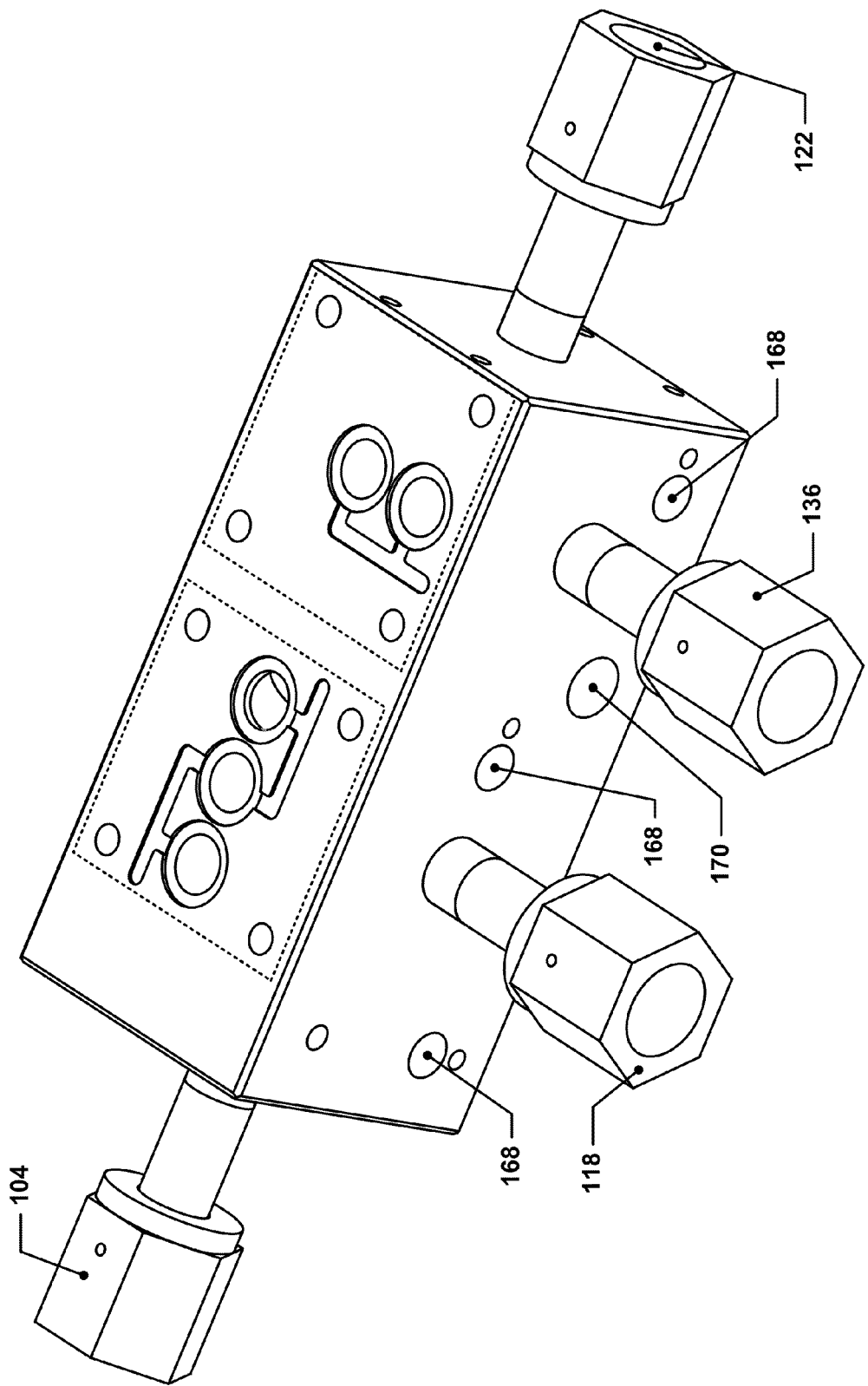
FIG. 1L shows a third view of the example POU valve manifold of FIG. 1A.

FIG. 1L depicts an off-angle view of the "underside" of the valve manifold 100. Visible in FIG. 1L are three heater interfaces 168, which may include, for example, a hole configured to receive a cartridge heater element and a neighboring retention screw hole configured to receive a fastener that retains the heater element within the receptacle. Also visible in FIG. 1L is a thermocouple interface 170 that may be used to mount a thermocouple for monitoring the temperature of the valve manifold 100. Alternatively, other temperature sensing technologies, e.g., thermistors, may be used.

Figure 1M:
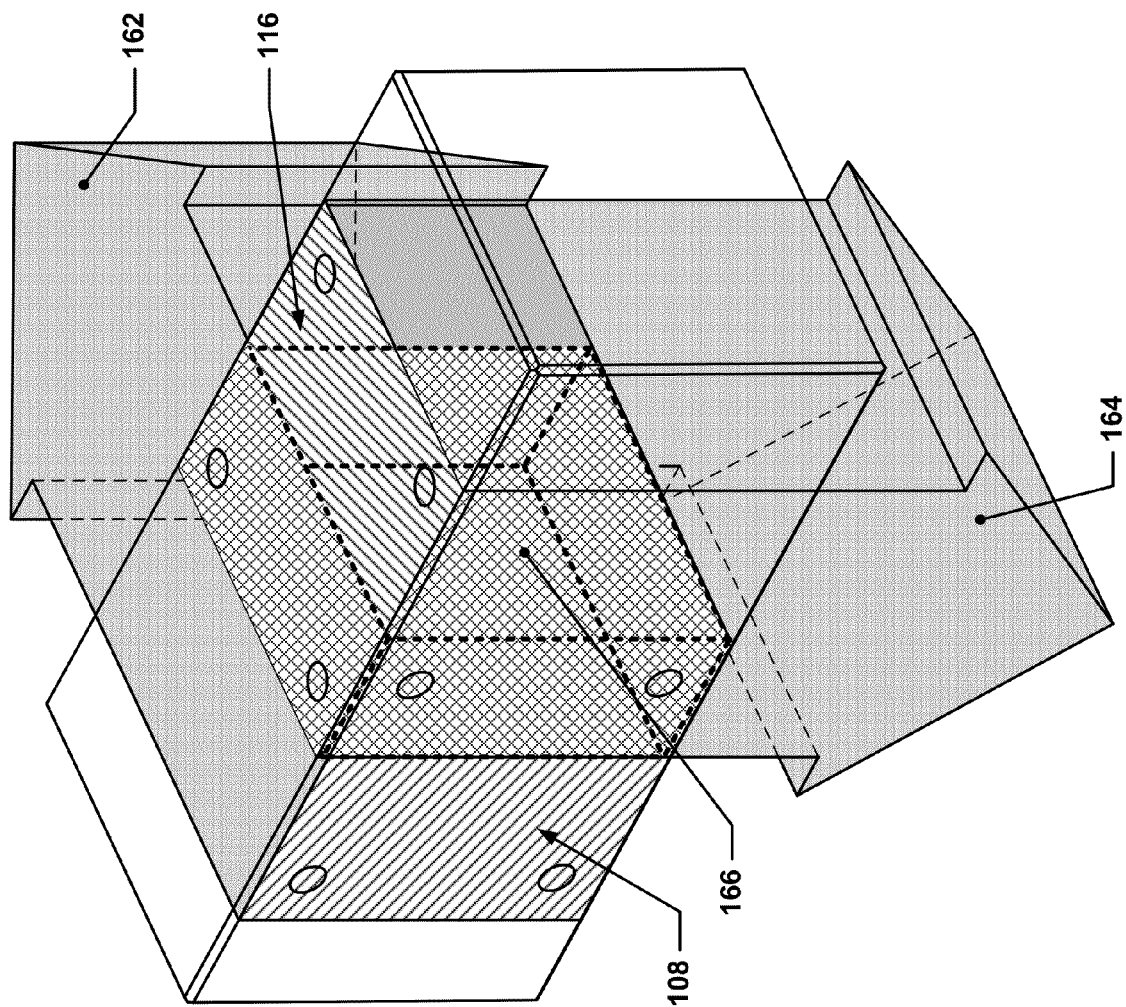
FIG. 1M shows a view of the example POU valve manifold of FIG. 1A with projected volumes associated with two valve interfaces depicted.

FIG. 1M depicts a simplified view of the valve manifold 100 from the perspective used in FIG. 1E (many features are omitted). The first valve interface 108 and the second valve interface 116 are shown, however. Also depicted are reference volumes defined by the projections of the valve interface areas in directions substantially normal to the respective valve interface areas. As can be seen, due to the overlap of the valve interfaces along an axis of the valve manifold, a first reference volume 162, defined by the projection of the first valve interface 108, and a second reference volume 164, defined by the projection of the second valve interface 116, intersect in a volume overlap 166 of the projected reference volumes.

Figure 2A:
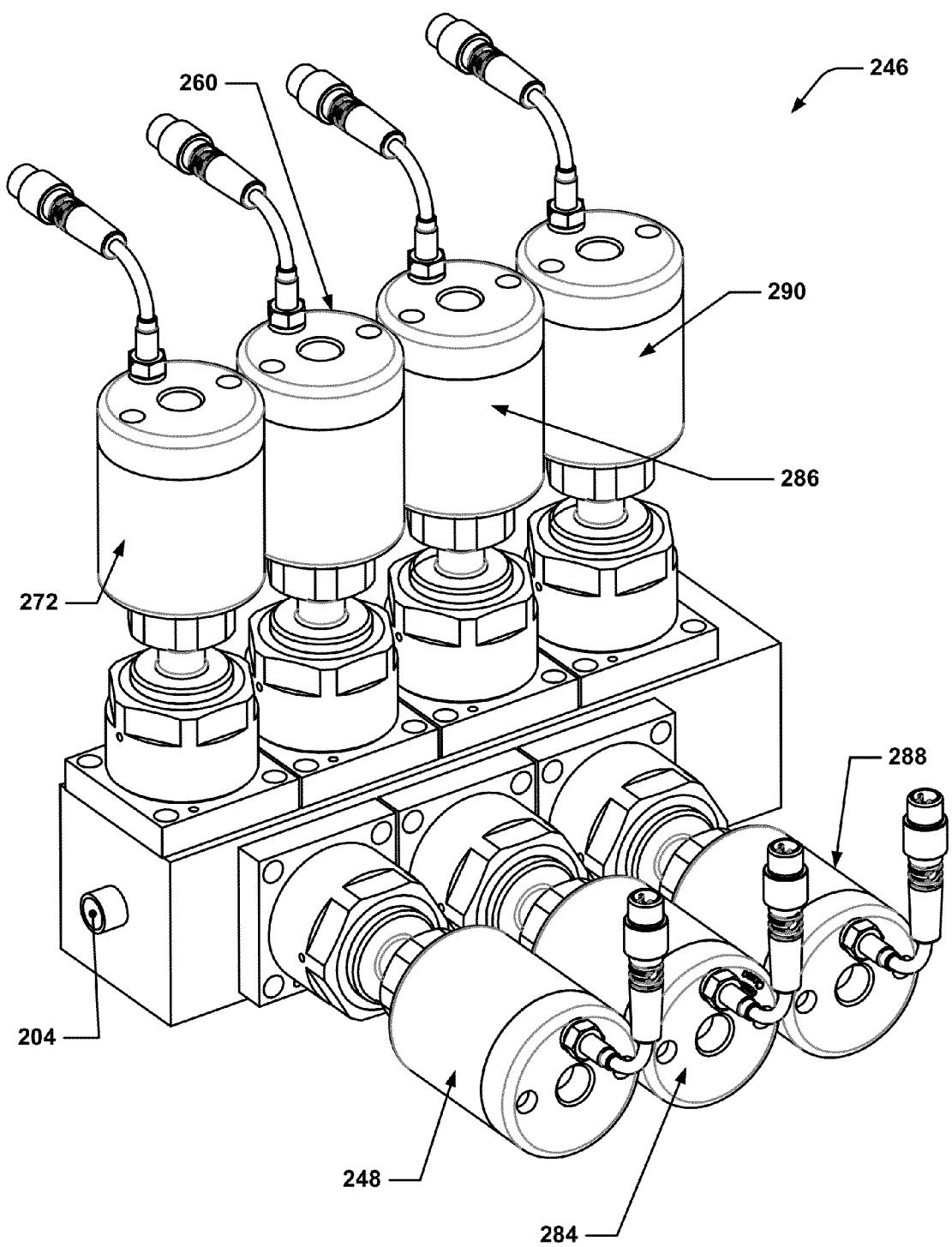
FIG. 2A shows an off-angle view of an example point-of-use valve (POU valve) manifold supporting six precursors and an outlet with POU valves attached.

FIG. 2A shows an off-angle view of an example POU valve manifold apparatus 246 supporting six precursors and an outlet. As can be seen, this implementation has a much larger number of valves than the version discussed above. This implementation also does not include a dump shunt. A purge gas inlet 204 is shown (although without a fitting attached), and a purge valve 272, a first valve 248, a second valve 260, a third valve 284, a fourth valve 286, a fifth valve 288, and a sixth valve 290 are also depicted.

Figure 2B:
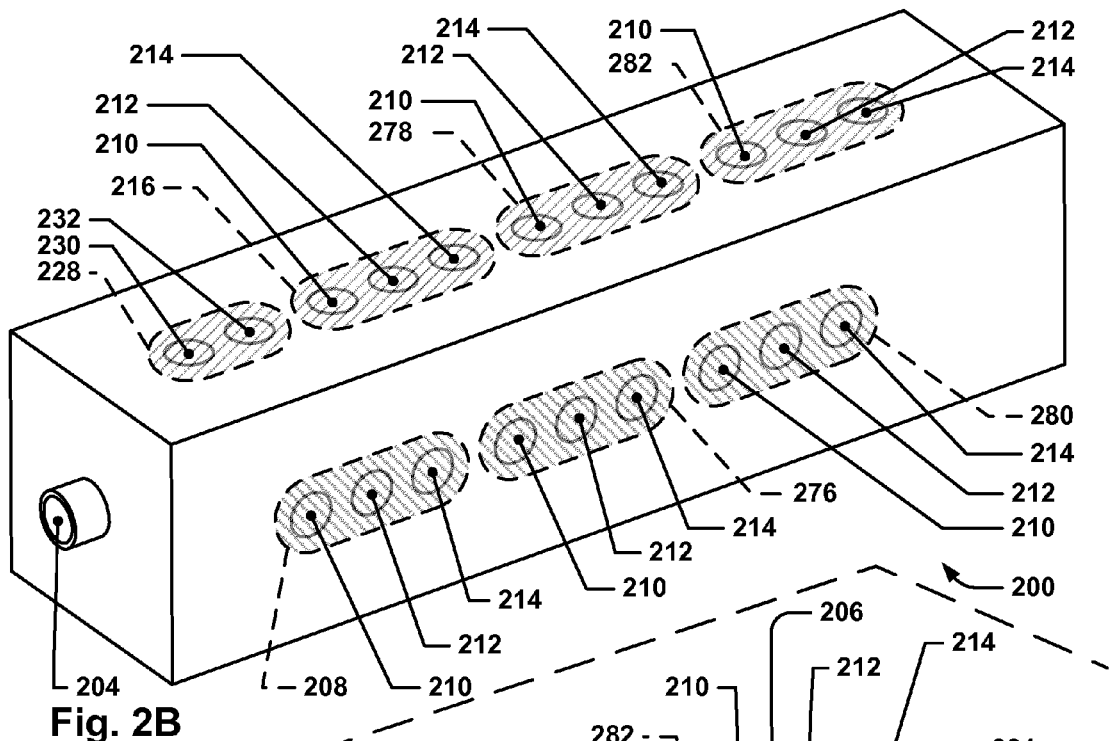
FIG. 2B shows the example POU valve manifold of FIG. 3A with no COTS valves attached.
Figure 2C:
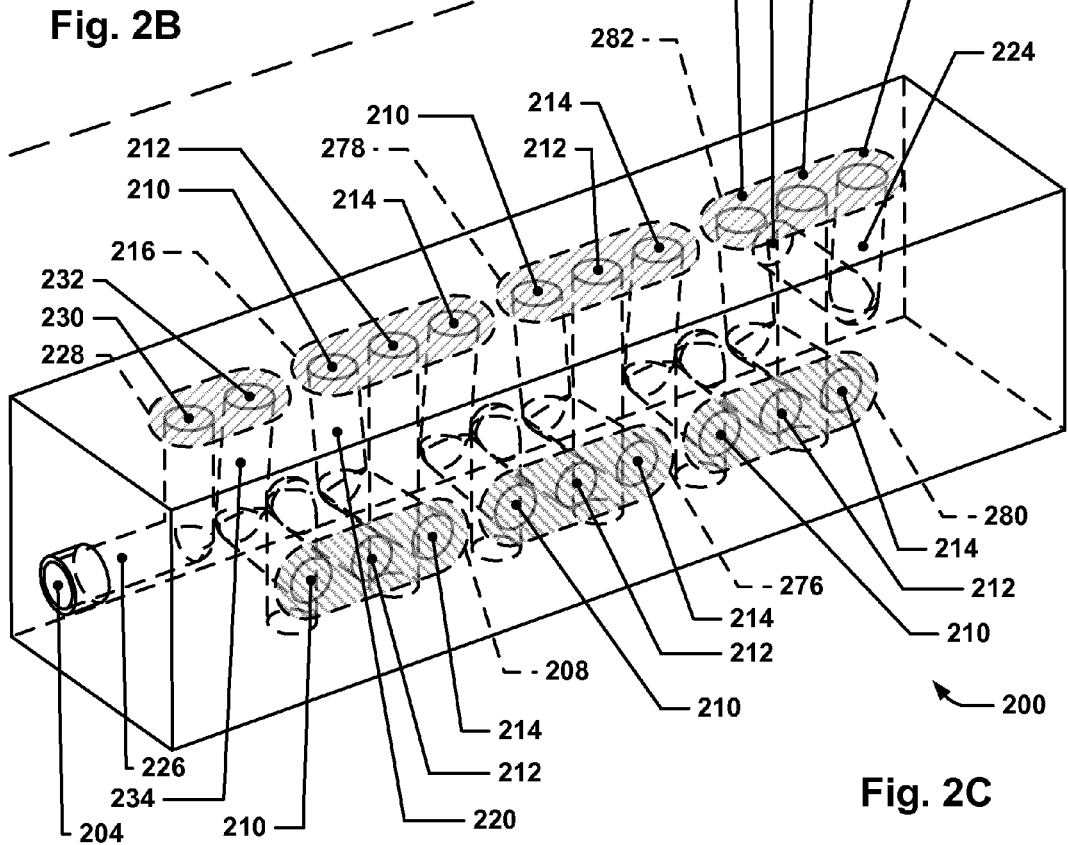
FIG. 2C shows a hidden-line view of the example POU valve manifold of FIG. 2A with no COTS valves attached.

FIG. 2B shows the example valve manifold 200 of FIG. 2A with no valves attached. FIG. 2C shows a hidden-line view of the example valve manifold 200 of FIG. 2A with no valves attached. As can be seen, the valves in this implementation are arranged with their port arrangements in-line; a configuration with some port arrangements perpendicular to each other, as with the purge valve interface 128 and the second valve interface 116 in FIG. 1A, may also be used if packaging constraints require it.

Also visible in FIGS. 2B and 2C are a purge valve interface 228 with a first port 230 and a second port 232, as well as a first valve interface 208, a second valve interface 216, a third valve interface 276, a fourth valve interface 278, a fifth valve interface 280, and a sixth valve interface 282, each with a first port 210, a second port 212, and a third port 214.

Also visible in FIG. 2C are assorted flow paths. For example, a first flow path 220 may fluidly connect the third port 214 of the first valve interface 208 with the first port 210 of the second valve interface 216. A second flow path 224 may fluidly connect the second port 212 of the sixth valve interface 282 with the manifold outlet 206. A third flow path 226 may fluidly connect the first port 230 of the purge valve interface 228 with the purge gas inlet 204. A fourth flow path may fluidly connect the first port 210 of the first valve interface 208 with the second port 232 of the purge valve interface 228. Additional flow paths may fluidly interconnect the first ports 210 and the second ports 214 of adjacent valves, as shown in FIG. 2C.

Figures 2D, 2E:
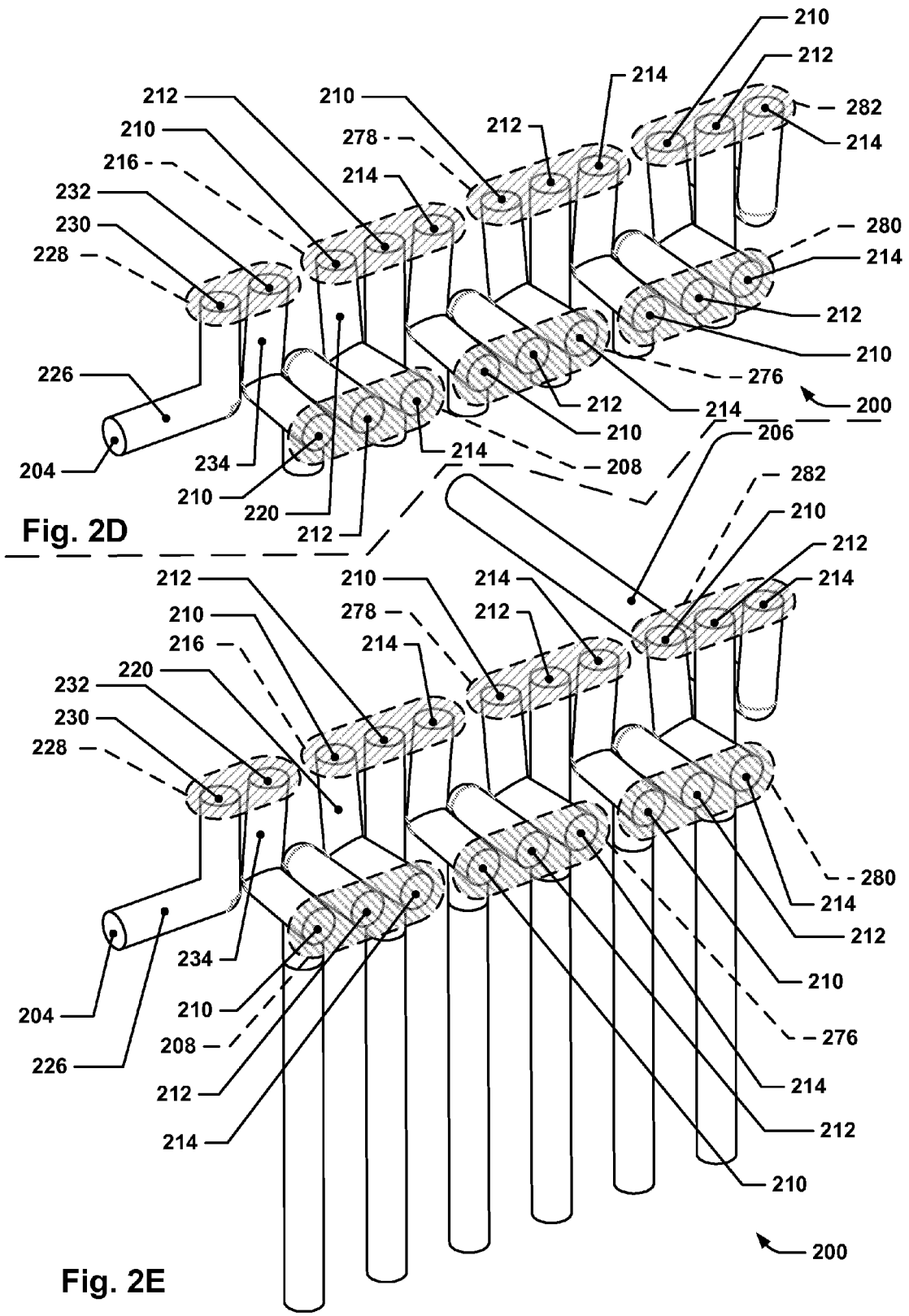
FIG. 2D shows the internal flow path volumes of the example POU valve manifold of FIG. 2A.
FIG. 2E shows the internal flow path volumes of the example POU valve manifold of FIG. 2D with extension volumes connected to the precursor inlets and the outlet to allow for easier viewing.

FIG. 2D shows the internal flow path volumes of the example valve manifold 200 of FIG. 2A. FIG. 2E shows the internal flow path volumes of the example POU valve manifold of FIG. 2A with extension volumes connected to the precursor inlets and the outlet to allow for easier viewing.

Figure 2F:
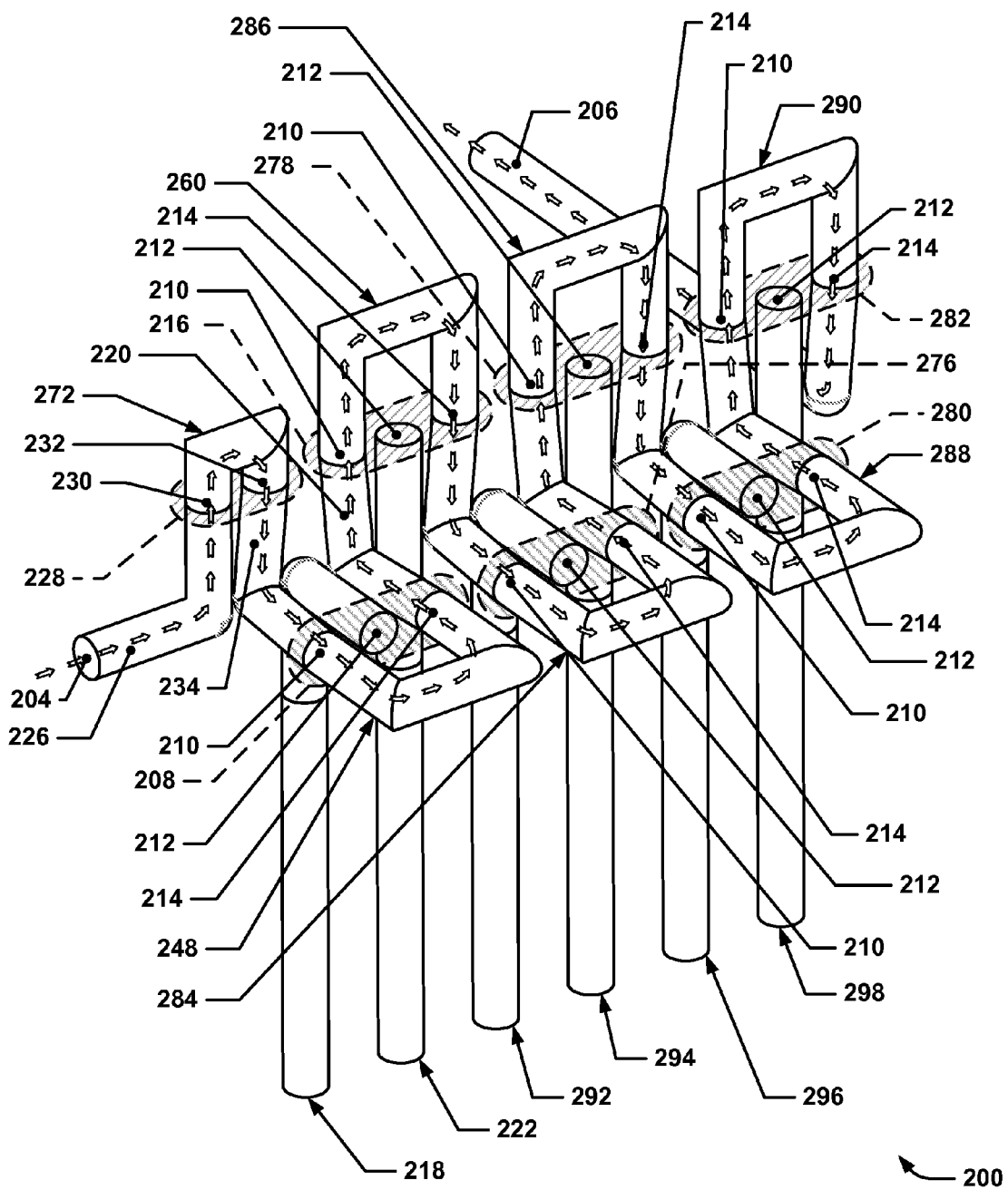
FIG. 2F shows the internal flow path volumes of FIG. 2E with additional flow path volumes representing flow inside of the valves connected to the manifold and demonstrating a purge cycle.

FIG. 2F shows the internal flow path volumes of FIG. 2E with additional flow path volumes, similar to those in FIG. 1H, representing flow inside of valves connected to the manifold and demonstrating a purge cycle. As can be seen, in a purge cycle, the first valve 248, the second valve 260, the third valve 284, the fourth valve 286, the fifth valve 288, and the sixth valve 290 are all in the "closed" state and the purge valve 272 is in the open state, allowing purge gas (white arrows) to flow from the purge gas inlet 204, through the fourth flow path 234, first flow path 220, etc. until it reaches the manifold outlet 206. It is to be understood that, as with the flow path volumes for the valves shown in FIG. 1H, the flow path volumes for the valves shown in FIGS. 2F through 2L are notional volumes and that the actual shape and size of such volumes may differ from that shown.

Figure 2G:
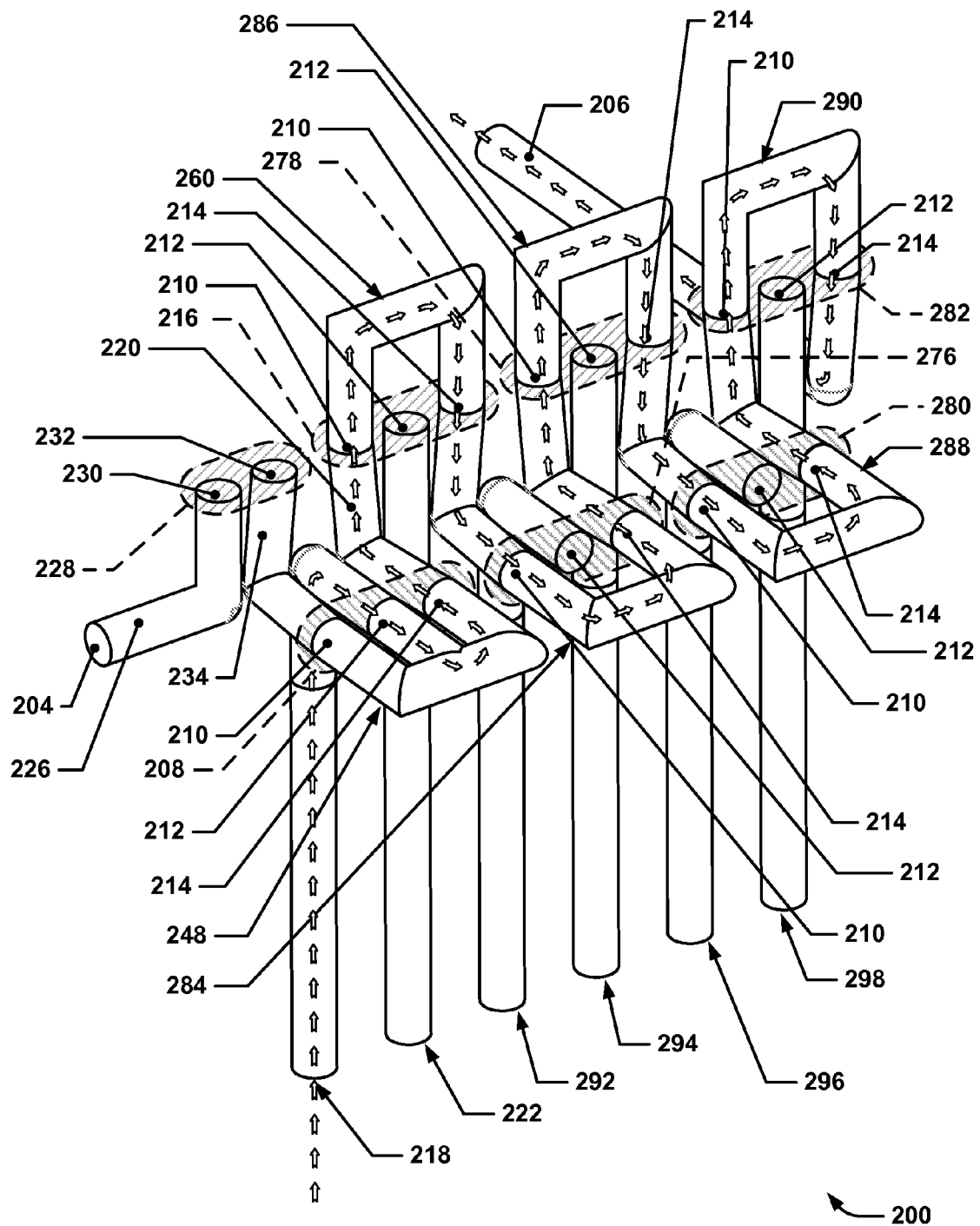
FIG. 2G shows the internal flow path volumes of FIG. 2E with additional flow path volumes representing flow inside of the valves connected to the manifold and demonstrating a delivery cycle for a first precursor.

FIG. 2G shows the internal flow path volumes of FIG. 2E and demonstrates a delivery cycle for a first process gas. As can be seen, in the first process gas delivery cycle, the purge valve 272, the second valve 260, the third valve 284, the fourth valve 286, the fifth valve 288, and the sixth valve 290 are all in the "closed" state and the first valve 248 is in the open state, allowing the first process gas (white arrows) to flow from the first process gas supply inlet 218 through the provided flow paths until it reaches the manifold outlet 206.

Figure 2H:
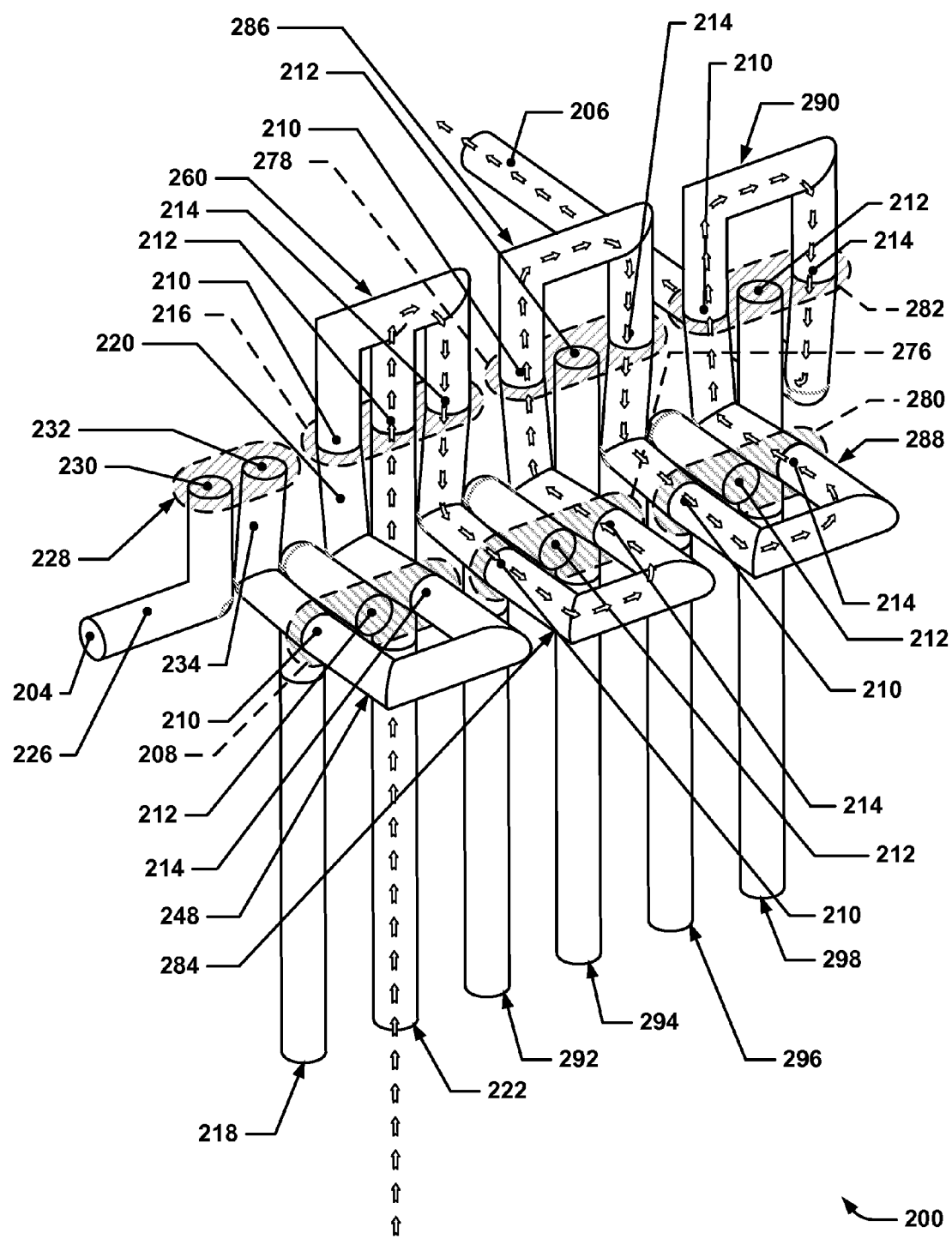
FIG. 2H shows the internal flow path volumes of FIG. 2E with additional flow path volumes representing flow inside of the valves connected to the manifold and demonstrating a delivery cycle for a second precursor.

FIG. 2H shows the internal flow path volumes of FIG. 2E and demonstrates a delivery cycle for a second process gas. As can be seen, in the second process gas delivery cycle, the purge valve 272, the first valve 248, the third valve 284, the fourth valve 286, the fifth valve 288, and the sixth valve 290 are all in the "closed" state and the second valve 260 is in the open state, allowing the second process gas (white arrows) to flow from the second process gas supply inlet 222 through the provided flow paths until it reaches the manifold outlet 206.

Figure 2I:
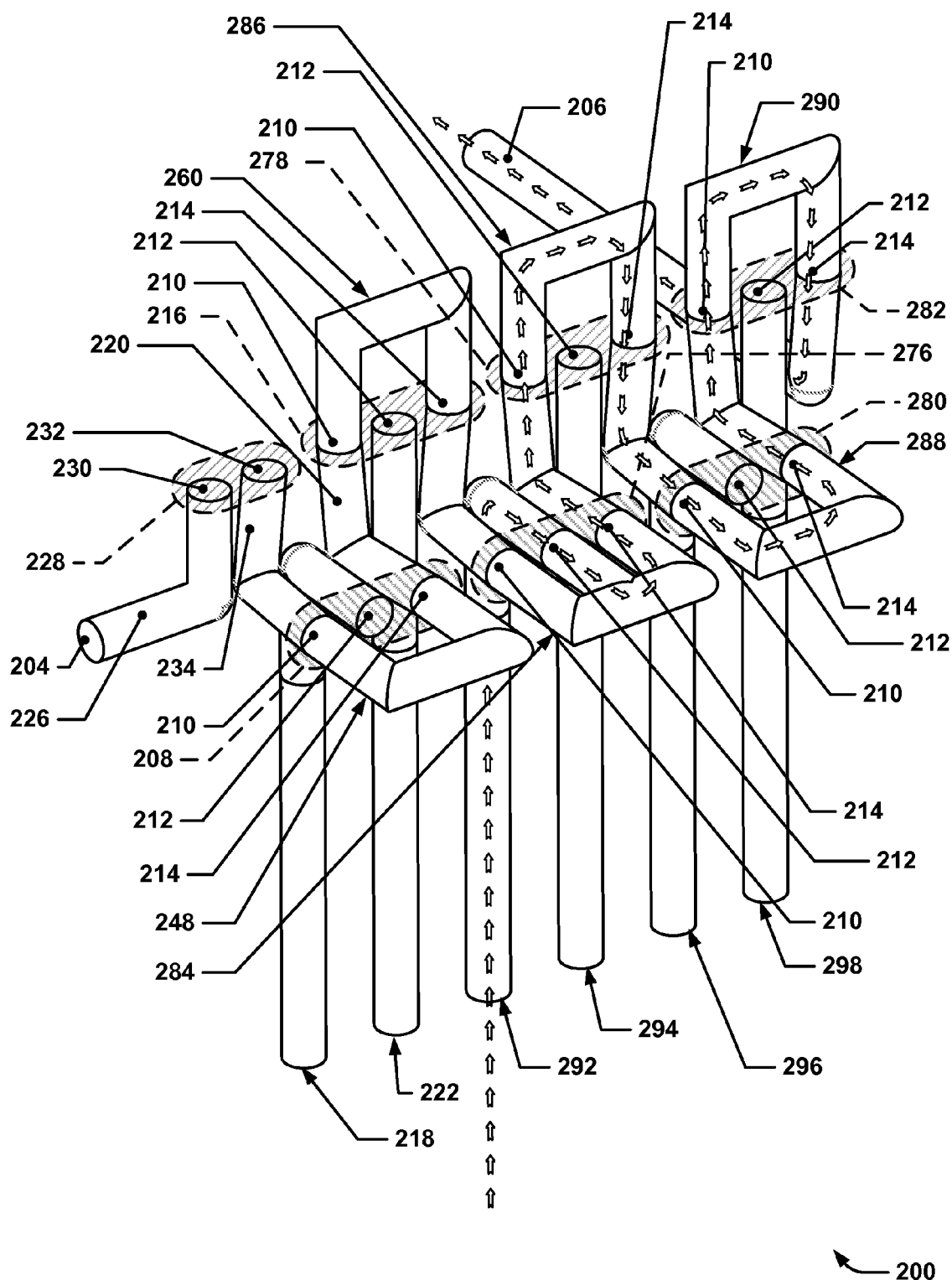
FIG. 2I shows the internal flow path volumes of FIG. 2E with additional flow path volumes representing flow inside of the valves connected to the manifold and demonstrating a delivery cycle for a third precursor.

FIG. 2I shows the internal flow path volumes of FIG. 2E and demonstrates a delivery cycle for a third process gas. As can be seen, in the third process gas delivery cycle, the purge valve 272, the first valve 248, the second valve 260, the fourth valve 286, the fifth valve 288, and the sixth valve 290 are all in the "closed" state and the third valve 284 is in the open state, allowing the third process gas (white arrows) to flow from the third process gas supply inlet 292 through the provided flow paths until it reaches the manifold outlet 206.

Figure 2J:
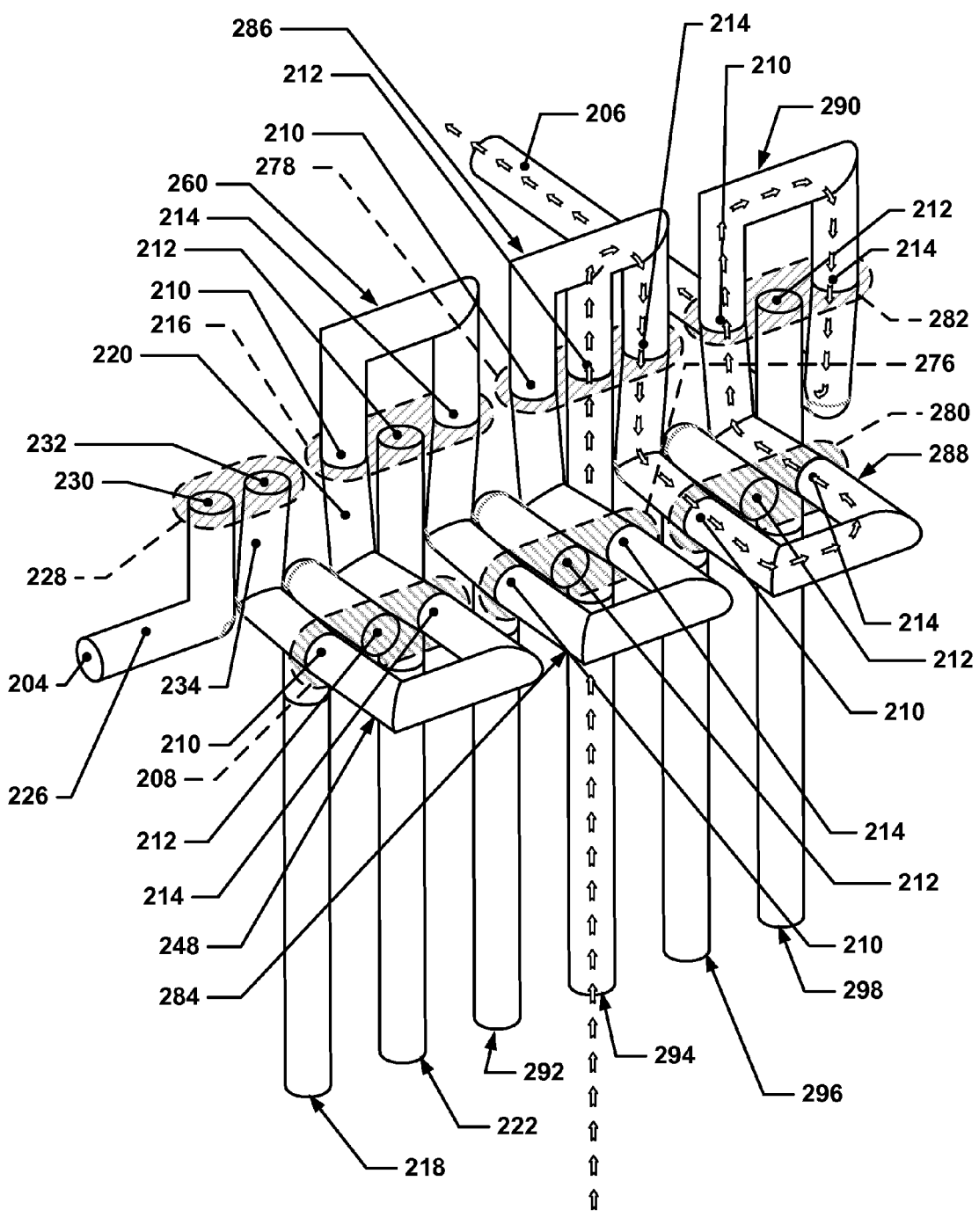
FIG. 2J shows the internal flow path volumes of FIG. 2E with additional flow path volumes representing flow inside of the valves connected to the manifold and demonstrating a delivery cycle for a fourth precursor.

FIG. 2J shows the internal flow path volumes of FIG. 2E and demonstrates a delivery cycle for a fourth process gas. As can be seen, in the fourth process gas delivery cycle, the purge valve 272, the first valve 248, the second valve 260, the third valve 284, the fifth valve 288, and the sixth valve 290 are all in the "closed" state and the fourth valve 284 is in the open state, allowing the fourth process gas (white arrows) to flow from the fourth process gas supply inlet 294 through the provided flow paths until it reaches the manifold outlet 206.

Figure 2K:
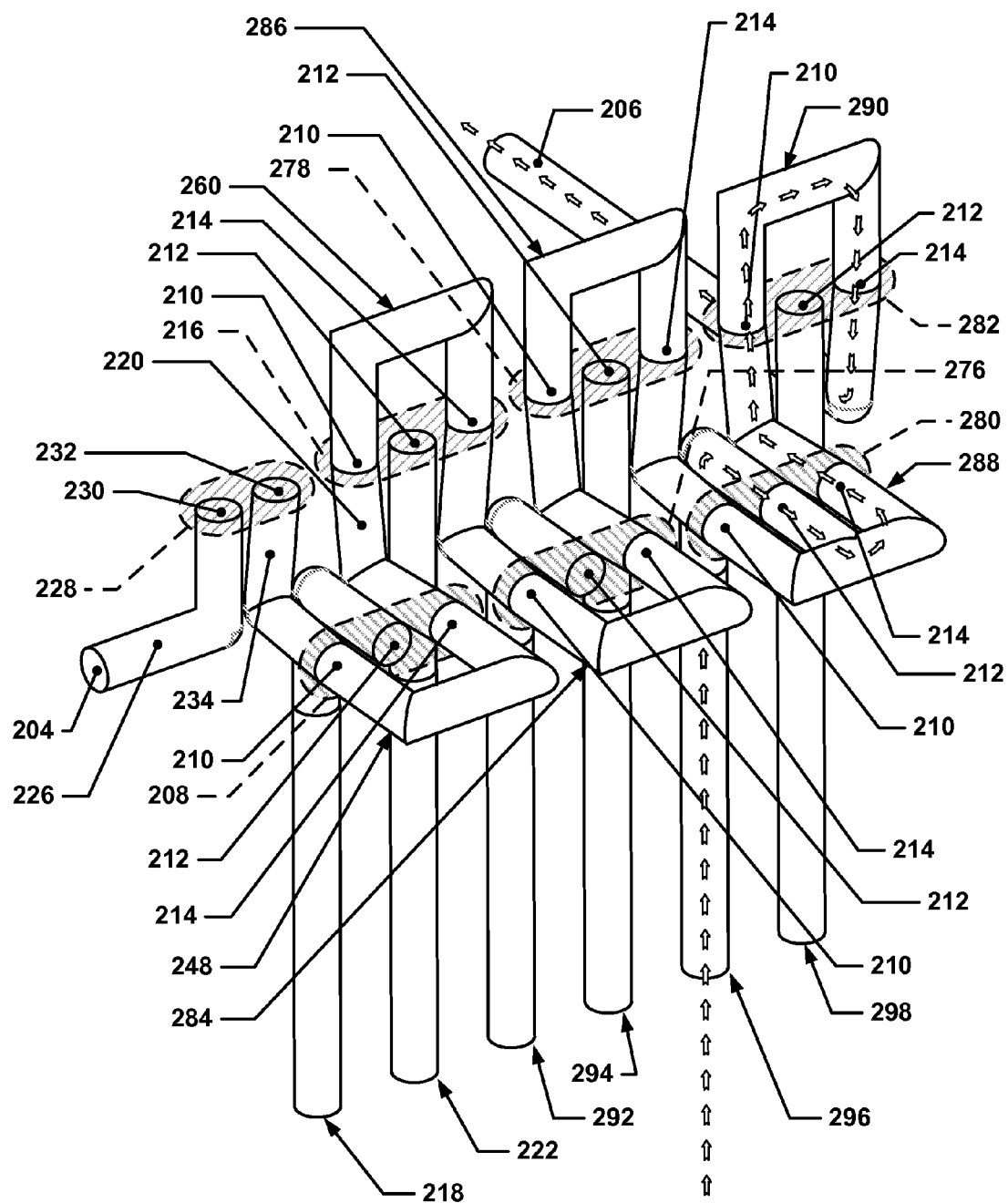
FIG. 2K shows the internal flow path volumes of FIG. 2E with additional flow path volumes representing flow inside of the valves connected to the manifold and demonstrating a delivery cycle for a fifth precursor.

FIG. 2K shows the internal flow path volumes of FIG. 2E and demonstrates a delivery cycle for a fifth process gas. As can be seen, in the fifth process gas delivery cycle, the purge valve 272, the first valve 248, the second valve 260, the third valve 284, the fourth valve 286, and the sixth valve 290 are all in the "closed" state and the fifth valve 288 is in the open state, allowing the fifth process gas (white arrows) to flow from the fifth process gas supply inlet 296 through the provided flow paths until it reaches the manifold outlet 206.

Figure 2L:
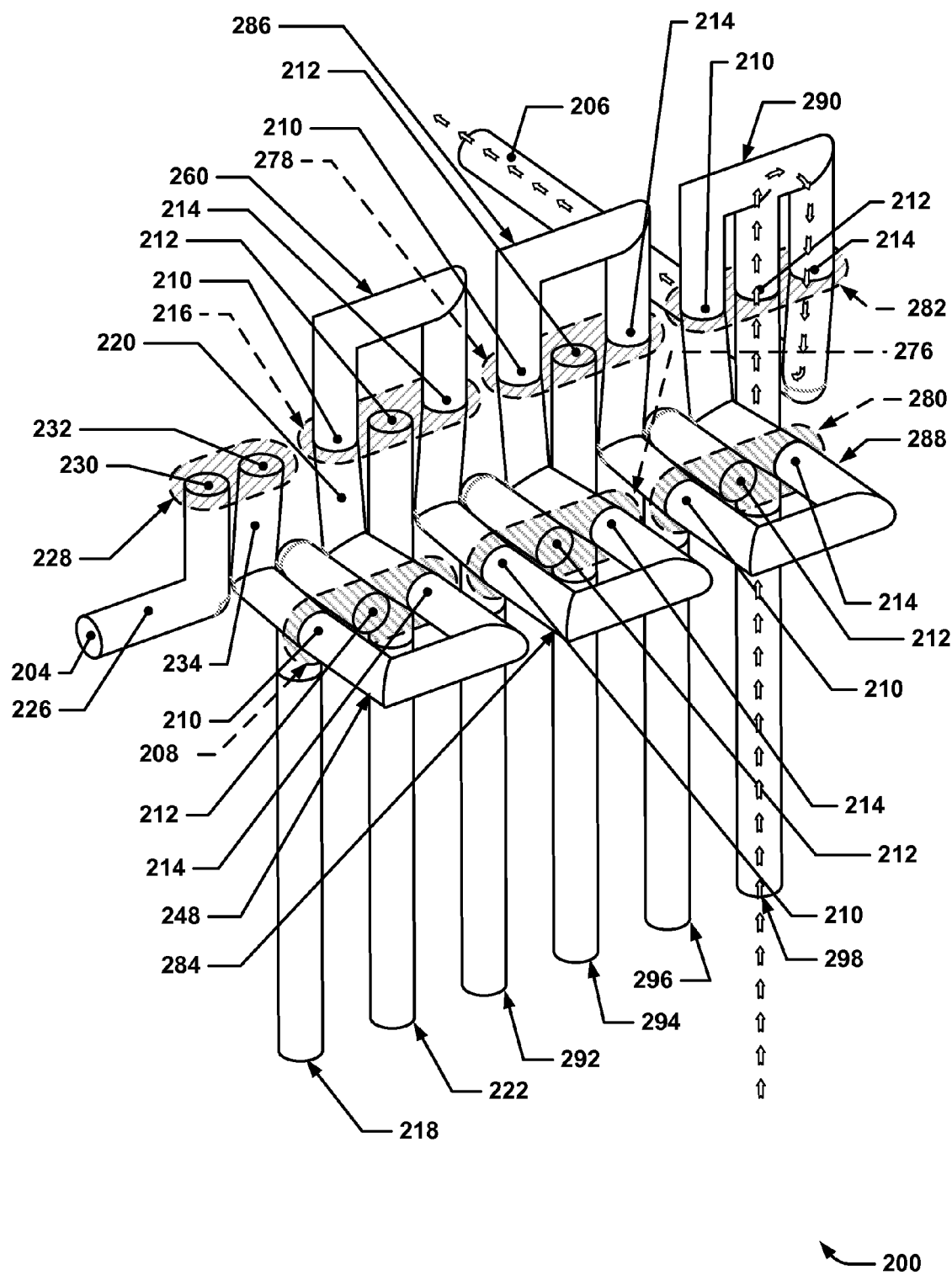
FIG. 2L shows the internal flow path volumes of FIG. 2E with additional flow path volumes representing flow inside of the valves connected to the manifold and demonstrating a delivery cycle for a sixth precursor.

FIG. 2L shows the internal flow path volumes of FIG. 2E and demonstrates a delivery cycle for a sixth process gas. As can be seen, in the sixth process gas delivery cycle, the purge valve 272, the first valve 248, the second valve 260, the third valve 284, the fourth valve 286, and the fifth valve 288 are all in the "closed" state and the sixth valve 290 is in the open state, allowing the process gas (white arrows) to flow from the sixth process gas supply inlet 298 through the provided flow paths until it reaches the manifold outlet 206. While the above-discussed figures have been described in the context of manifold operation in the context of single-gas delivery, it is to be understood that multiple process gases may also be delivered at the same time, if permissible from a process chemistry standpoint, to increase the processing time and reduce purging time.

The POU valve manifolds described herein may be used in either of two modes. In the first, or segregated mode, each precursor gas may be introduced to the chamber through the manifold followed by an intentional purge before introduction of the next precursor through the manifold (pulse-purge-pulse-purge behavior). This prevents any mixing of precursors within the manifold and enables running sequences where a pure precursor gas is required in the chamber without any added diluents (either due to lack of saturation of that ALD step or wafer thickness non-uniformity reasons]. In the second, or continuous, mode, a carrier gas (which may be a gas such as that used to purge the manifold, for example) may be continuously provided through the purge inlet while the precursor gases are sequentially introduced into the gas flowing through the manifold. Such a mode works when added diluents can be tolerated and/or when the valve manifold has two outlets each leading to separate sections on a dual plenum gas distribution manifold/showerhead in the chamber.

The POU valve manifolds described herein may also be used in reverse, e.g., to allow for multiple outlets to be serviced from a single process gas inlet, e.g., by using the manifold outlet as a process gas inlet, and by using the process gas inlets as manifold outlets.

The POU valve manifold may be manufactured from stainless steel or other metals, such as VIM VAR, AOD/VAR, or Hastelloy materials. In some implementations, the POU valve may be made from aluminum that would passivate with aluminum fluoride upon exposure to fluorine-based precursors or cleaning agents. In some other implementations, the manifold may be made from ceramics, e.g., aluminum oxide. In some implementations, the manifold, or at least the internal flow passages, may be coated with a coating such as Yttrium Fluoride ($YF_3$).

Depending on the materials used for the manifold block, various sealing options may be adopted to seal the POU valves to the manifold. Various surface-mount sealing technologies, e.g., metal C or W seals, may be used to seal the interface between the POU valves and the manifold. In aluminum manifolds, however, elastomeric seals may be used instead.

In some implementations, the manifold may include receptacles for heater inserts. Such heater inserts may be situated to be close to the precursor inlets to maintain the precursors at elevated temperatures and prevent condensation within the manifold. The manifold may also include a receptacle for a thermocouple to monitor the temperature of the manifold. FIG. 1L depicts locations of heater insert holes and a thermocouple mounting location on the manifold shown in FIG. 1A.

In some implementations, the manifold may include flow restrictors that are either built into the manifold or removably inserted into the manifold. Such flow restrictors may be configured to have flow restrictions greater than the flow restrictions of the POU valves. In this manner, the flow restrictors may serve as the most-restricted choke points in the manifold assembly. This may be desirable to avoid flow restriction variability that may be seen if the POU valves are the most-restricted choke points. This may be particularly useful in implementations where multiple POU valve manifolds are used with a common precursor source and it is necessary to match the flows out of each POU valve manifold.

In some implementations, the precursor gas may be valved such that the precursor gas may be diverted to a pump rather than through the manifold. Such implementations may involve plumbing external to the POU valve manifold.

Another aspect of the invention is an apparatus configured to utilize the POU valve manifold described herein. A suitable apparatus may include one or more POU valve manifolds as described above, and a system controller having instructions for controlling the POU valves for those manifolds to perform operations in accordance with the gas flow requirements of a particular semiconductor process. The system controller will typically include one or more memory devices and one or more processors configured to execute the instructions so that the apparatus will control the POU valve manifold in accordance with the present invention, e.g., open/close the various POU valves in the manifold, monitor temperature levels in the manifold, and control any heater elements inserted into the manifold. Machine-readable media containing instructions for controlling process operations in accordance with the present invention may be coupled to the system controller.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

It will also be understood that unless features in any of the particular described implementations are expressly identified as incompatible with one another or the surrounding context implies that they are mutually exclusive and not readily combinable in a complementary and/or supportive sense, the totality of this disclosure contemplates and envisions that specific features of those complementary implementations can be selectively combined to provide one or more comprehensive, but slightly different, technical solutions. It will therefore be further appreciated that the above description has been given by way of example only and that modifications in detail may be made within the scope of the invention.

What is claimed is:

1. A valve manifold for use in a semiconductor processing tool, comprising:
   a manifold body;
   a purge gas inlet;
   a manifold outlet, the manifold outlet located on a first side of the manifold body;
   a first valve interface, the first valve interface located on a second side of the manifold body different from the first side; and
   a second valve interface, the second valve interface located on a third side of the manifold body different from the first side and the second side, wherein:
      the first valve interface and the second valve interface each include a first port, a second port, and a third port,
      the second port of the first valve interface is configured to connect to a first process gas supply,
      the third port of the first valve interface is fluidly connected with the first port of the second valve interface via a first flow path internal to the manifold body and having no dead legs,
      the second port of the second valve interface is fluidly connected with an interface configured to connect to a second process gas supply,
      the third port of the second valve interface is fluidly connected with the manifold outlet by a second flow path internal to the manifold body and having no dead legs, and
      the purge gas inlet is fluidly connected with the first port of the first valve interface by a third flow path internal to the manifold body and having no dead legs.

2. The valve manifold of claim 1, comprising:
   a dump shunt outlet; and
   a dump shunt valve interface, wherein:
      the dump shunt valve interface includes a first port and a second port,
      the first port of the dump shunt valve interface is fluidly connected with the second port of the second valve interface by a fourth flow path internal to the manifold body, and
      the second port of the dump shunt valve interface is fluidly connected with the dump shunt outlet by a fifth flow path internal to the manifold body.

3. The valve manifold of claim 1, wherein the side of the manifold body where the manifold outlet is located is configured to be attached to mating features on a semiconductor processing chamber.

4. The valve manifold of claim 1, wherein:
   there is overlap between a first reference volume defined by a projection of the outer boundary of the first valve interface in a direction substantially normal to the second side and a second reference volume defined by a projection of the outer boundary of the second valve interface in a direction substantially normal to the third side, and
   the first valve interface and the second valve interface are offset from one another in a direction parallel to both the second side and the third side.

5. The valve manifold of claim 1, wherein the manifold body further includes one or more heater interfaces, each configured to accept a heating device.

6. The valve manifold of claim 5, wherein the one or more heater interfaces are receptacles within the manifold body.

7. An apparatus for delivery of a purge gas, a first process gas, and a second process gas to a semiconductor processing tool, the apparatus comprising:
   a valve manifold, wherein the valve manifold comprises:
      a manifold body,
      a purge gas inlet,
      a manifold outlet, the manifold outlet located on a first side of the manifold body,
      a first valve interface, the first valve interface located on a second side of the manifold body different from the first side, and
      a second valve interface, the second valve interface located on a third side of the manifold body different from the first side and the second side, wherein:
         the first valve interface and the second valve interface each include a first port, a second port, and a third port,
         the second port of the first valve interface is configured to connect to a first process gas supply,
         the third port of the first valve interface is fluidly connected with the first port of the second valve interface via a first flow path internal to the manifold body and having no dead legs,
         the second port of the second valve interface is configured to connect to a second process gas supply,
         the third port of the second valve interface is fluidly connected with the manifold outlet by a second flow path internal to the manifold body and having no dead legs, and
         the purge gas inlet is fluidly connected with the first port of the first valve interface by a third flow path internal to the manifold body and having no dead legs;
   a first valve; and
   a second valve, wherein the first valve and the second valve each include a valve body, a manifold interface area including a first valve port, a second valve port, and a third valve port, and a valve mechanism movable between an open state and a closed state, and wherein:
      the first valve port is fluidly connected to the third valve port when the valve mechanism is in both the open state and in the closed state, and
      the second valve port is fluidly connected to the first valve port and the third valve port when the valve mechanism is in the open state and is not fluidly connected to the first valve port and the third valve port when the valve mechanism is in the closed state, wherein:
      the first valve port of the first valve is fluidly connected to the first port of the first valve interface,
      the second valve port of the first valve is fluidly connected to the second port of the first valve interface,
      the third valve port of the first valve is fluidly connected to the third port of the first valve interface,
      the first valve port of the second valve is fluidly connected to the first port of the second valve interface, the second valve port of the second valve is fluidly connected to the second port of the second valve interface, and the third valve port of the second valve is fluidly connected to the third port of the second valve interface.

8. The apparatus of claim 7, wherein:

a first gasket provides a seal between the first valve port of the first valve and the first port of the first valve interface;

a second gasket provides a seal between the second valve port of the first valve and the second port of the first valve interface;

a third gasket provides a seal between the third valve port of the first valve and the third port of the first valve interface;

a fourth gasket provides a seal between the first valve port of the second valve and the first port of the second valve interface;

a fifth gasket provides a seal between the second valve port of the second valve and the second port of the second valve interface; and a sixth gasket provides a seal between the third valve port of the second valve and the third port of the second valve interface.

9. The apparatus of claim 8, wherein the first gasket, the second gasket, the third gasket, the fourth gasket, the fifth gasket, and the sixth gasket are each selected from the group consisting of a C seal, a W seal, and an elastomeric seal.

10. The apparatus of claim 7, wherein the valve manifold further comprises:

a dump shunt outlet; and a dump shunt valve interface, wherein:

the dump shunt valve interface includes a first port and a second port, the first port of the dump shunt valve interface is fluidly connected with the second port of the second valve interface by a fourth flow path internal to the manifold body, and the second port of the dump shunt valve interface is fluidly connected with the dump shunt outlet by a fifth flow path internal to the manifold body.

11. The apparatus of claim 7, wherein the side of the manifold body where the manifold outlet is located is configured to be mated with mating features on a semiconductor processing chamber.

12. The apparatus of claim 7, wherein:

there is overlap between a first reference volume defined by a projection of the outer boundary of the first valve interface in a direction substantially normal to the second side and a second reference volume defined by a projection of the outer boundary of the second valve interface in a direction substantially normal to the third side, and the first valve interface and the second valve interface are offset from one another in a direction parallel to both the second side and the third side.

13. The apparatus of claim 7, wherein the manifold body further includes one or more heater interfaces, each configured to accept a heating device.

14. The apparatus of claim 13, wherein the one or more heater interfaces are receptacles within the manifold body.

15. The apparatus of claim 7, wherein the first flow path within the manifold body includes a flow restriction that is greater than either a maximum first flow restriction through the first valve or a maximum second flow restriction through the second valve when the valve mechanism of the first valve is in the open state and the valve mechanism of the second valve is in the open state, respectively.

16. The apparatus of claim 7, further comprising a temperature sensor configured to monitor the temperature of the manifold body.

17. A valve manifold for use in a semiconductor processing tool, comprising:

a manifold body;

a purge gas inlet;

a manifold outlet, the manifold outlet located on a first side of the manifold body;

a first valve interface, the first valve interface located on a second side of the manifold body different from the first side;

a second valve interface, the second valve interface located on a third side of the manifold body different from the first side and the second side; and a purge valve interface, wherein:

the first valve interface and the second valve interface each include a first port, a second port, and a third port, the second port of the first valve interface is configured to connect to a first process gas supply, the third port of the first valve interface is fluidly connected with the first port of the second valve interface via a first flow path internal to the manifold body and having no dead legs, the second port of the second valve interface is fluidly connected with an interface configured to connect to a second process gas supply, the third port of the second valve interface is fluidly connected with the manifold outlet by a second flow path internal to the manifold body and having no dead legs, the purge valve interface includes a first port and a second port, the purge gas inlet is fluidly connected with the first port of the purge valve interface by a third flow path internal to the manifold body, and the second port of the purge valve interface is fluidly connected with the first port of the first valve interface by a fourth flow path internal to the manifold body and having no dead legs.

18. The valve manifold of claim 17, comprising:

a dump shunt outlet; and a dump shunt valve interface, wherein:

the dump shunt valve interface includes a first port and a second port, the first port of the dump shunt valve interface is fluidly connected with the second port of the second valve interface by a fifth flow path internal to the manifold body, and the second port of the dump shunt valve interface is fluidly connected with the dump shunt outlet by a sixth flow path internal to the manifold body.

19. The valve manifold of claim 17, wherein:

there is overlap between a first reference volume defined by a projection of the outer boundary of the first valve interface in a direction substantially normal to the second side and a second reference volume defined by a projection of the outer boundary of the second valve interface in a direction substantially normal to the third side, and the first valve interface and the second valve interface are offset from one another in a direction parallel to both the second side and the third side.

20. An apparatus for delivery of a purge gas, a first process gas, and a second process gas to a semiconductor processing tool, the apparatus comprising:

a valve manifold, wherein the valve manifold comprises:
  a manifold body,
  a purge gas inlet,
  a manifold outlet, the manifold outlet located on a first side of the manifold body,
  a first valve interface, the first valve interface located on a second side of the manifold body different from the first side,
  a second valve interface, the second valve interface located on a third side of the manifold body different from the first side and the second side,
  a purge valve interface, wherein:
    the first valve interface and the second valve interface each include a first port, a second port, and a third port,
    the second port of the first valve interface is configured to connect to a first process gas supply,
    the third port of the first valve interface is fluidly connected with the first port of the second valve interface via a first flow path internal to the manifold body and having no dead legs,
    the second port of the second valve interface is configured to connect to a second process gas supply,
    the third port of the second valve interface is fluidly connected with the manifold outlet by a second flow path internal to the manifold body and having no dead legs,
    the purge valve interface includes a first port and a second port,
    the purge gas inlet is fluidly connected with the first port of the purge valve interface by a third flow path internal to the manifold body, and
    the second port of the purge valve interface is fluidly connected with the first port of the first valve interface by a fourth flow path internal to the manifold body and having no dead legs;
  a first valve; and
  a second valve, wherein the first valve and the second valve each include a valve body, a manifold interface area including a first valve port, a second valve port, and a third valve port, and a valve mechanism movable between an open state and a closed state, and wherein:
    the first valve port is fluidly connected to the third valve port when the valve mechanism is in both the open state and in the closed state, and
    the second valve port is fluidly connected to the first valve port and the third valve port when the valve mechanism is in the open state and is not fluidly connected to the first valve port and the third valve port when the valve mechanism is in the closed state, wherein:
    the first valve port of the first valve is fluidly connected to the first port of the first valve interface,
    the second valve port of the first valve is fluidly connected to the second port of the first valve interface,
    the third valve port of the first valve is fluidly connected to the third port of the first valve interface,
    the first valve port of the second valve is fluidly connected to the first port of the second valve interface,
    the second valve port of the second valve is fluidly connected to the second port of the second valve interface, and
    the third valve port of the second valve is fluidly connected to the third port of the second valve interface.

21. The apparatus of claim 20, wherein the valve manifold further comprises:
  a dump shunt outlet; and
  a dump shunt valve interface, wherein:
    the dump shunt valve interface includes a first port and a second port,
    the first port of the dump shunt valve interface is fluidly connected with the second port of the second valve interface by a fifth flow path internal to the manifold body, and
    the second port of the dump shunt valve interface is fluidly connected with the dump shunt outlet by a sixth flow path internal to the manifold body.

22. The apparatus of claim 20, wherein:
  there is overlap between a first reference volume defined by a projection of the outer boundary of the first valve interface in a direction substantially normal to the second side and a second reference volume defined by a projection of the outer boundary of the second valve interface in a direction substantially normal to the third side, and
  the first valve interface and the second valve interface are offset from one another in a direction parallel to both the second side and the third side.

23. A valve manifold for use in a semiconductor processing tool, comprising:
  a manifold body;
  a purge gas inlet;
  a manifold outlet, the manifold outlet located on a first side of the manifold body;
  a first valve interface, the first valve interface located on a second side of the manifold body different from the first side;
  a second valve interface, the second valve interface located on a third side of the manifold body different from the first side and the second side;
  a dump shunt outlet; and
  a dump shunt valve interface, wherein:
    the first valve interface and the second valve interface each include a first port, a second port, and a third port,
    the second port of the first valve interface is configured to connect to a first process gas supply,
    the third port of the first valve interface is fluidly connected with the first port of the second valve interface via a first flow path internal to the manifold body and having no dead legs,
    the second port of the second valve interface is fluidly connected with an interface configured to connect to a second process gas supply,
    the third port of the second valve interface is fluidly connected with the manifold outlet by a second flow path internal to the manifold body and having no dead legs,
    the dump shunt valve interface includes a first port and a second port,
    the first port of the dump shunt valve interface is fluidly connected with the second port of the second valve interface by a third flow path internal to the manifold body, and
    the second port of the dump shunt valve interface is fluidly connected with the dump shunt outlet by a fourth flow path internal to the manifold body.

24. The valve manifold of claim 23, wherein the purge gas inlet is fluidly connected with the first port of the first valve interface by a fifth flow path internal to the manifold body and having no dead legs.

25. The valve manifold of claim 23, comprising a purge valve interface, wherein:

the purge valve interface includes a first port and a second port;

the purge gas inlet is fluidly connected with the first port of the purge valve interface by a fifth flow path internal to the manifold body; and the second port of the purge valve interface is fluidly connected with the first port of the first valve interface by a sixth flow path internal to the manifold body and having no dead legs.

26. The valve manifold of claim 23, wherein:

there is overlap between a first reference volume defined by a projection of the outer boundary of the first valve interface in a direction substantially normal to the second side and a second reference volume defined by a projection of the outer boundary of the second valve interface in a direction substantially normal to the third side, and the first valve interface and the second valve interface are offset from one another in a direction parallel to both the second side and the third side.

27. An apparatus for delivery of a purge gas, a first process gas, and a second process gas to a semiconductor processing tool, the apparatus comprising:

a valve manifold, wherein the valve manifold comprises:
 a manifold body,
 a purge gas inlet,
 a manifold outlet, the manifold outlet located on a first side of the manifold body,
 a first valve interface, the first valve interface located on a second side of the manifold body different from the first side,
 a second valve interface, the second valve interface located on a third side of the manifold body different from the first side and the second side,
 a dump shunt outlet, and
 a dump shunt valve interface, wherein:
  the first valve interface and the second valve interface each include a first port, a second port, and a third port,
  the second port of the first valve interface is configured to connect to a first process gas supply,
  the third port of the first valve interface is fluidly connected with the first port of the second valve interface via a first flow path internal to the manifold body and having no dead legs,
  the second port of the second valve interface is configured to connect to a second process gas supply,
  the third port of the second valve interface is fluidly connected with the manifold outlet by a second flow path internal to the manifold body and having no dead legs,
  the dump shunt valve interface includes a first port and a second port,
  the first port of the dump shunt valve interface is fluidly connected with the second port of the second valve interface by a third flow path internal to the manifold body, and
  the second port of the dump shunt valve interface is fluidly connected with the dump shunt outlet by a fourth flow path internal to the manifold body;

a first valve; and
a second valve, wherein the first valve and the second valve each include a valve body, a manifold interface area including a first valve port, a second valve port, and a third valve port, and a valve mechanism movable between an open state and a closed state, and wherein:
 the first valve port is fluidly connected to the third valve port when the valve mechanism is in both the open state and in the closed state, and
 the second valve port is fluidly connected to the first valve port and the third valve port when the valve mechanism is in the open state and is not fluidly connected to the first valve port and the third valve port when the valve mechanism is in the closed state, wherein:
 the first valve port of the first valve is fluidly connected to the first port of the first valve interface,
 the second valve port of the first valve is fluidly connected to the second port of the first valve interface,
 the third valve port of the first valve is fluidly connected to the third port of the first valve interface,
 the first valve port of the second valve is fluidly connected to the first port of the second valve interface,
 the second valve port of the second valve is fluidly connected to the second port of the second valve interface, and
 the third valve port of the second valve is fluidly connected to the third port of the second valve interface.

28. The apparatus of claim 26, wherein the purge gas inlet is fluidly connected with the first port of the first valve interface by a third flow path internal to the manifold body and having no dead legs.

29. The apparatus of claim 26, wherein the valve manifold further comprises a purge valve interface, wherein:

the purge valve interface includes a first port and a second port;

the purge gas inlet is fluidly connected with the first port of the purge valve interface by a fifth flow path internal to the manifold body; and the second port of the purge valve interface is fluidly connected with the first port of the first valve interface by a sixth flow path internal to the manifold body and having no dead legs.

30. The apparatus of claim 26, wherein:

there is overlap between a first reference volume defined by a projection of the outer boundary of the first valve interface in a direction substantially normal to the second side and a second reference volume defined by a projection of the outer boundary of the second valve interface in a direction substantially normal to the third side, and the first valve interface and the second valve interface are offset from one another in a direction parallel to both the second side and the third side.

* * * * *